(12) United States Patent
Ruoff

(10) Patent No.: US 9,041,908 B2
(45) Date of Patent: May 26, 2015

(54) METHOD FOR OPERATING A PROJECTION EXPOSURE APPARATUS WITH CORRECTION OF IMAGING ABERRATIONS INDUCED BY THE MASK

(75) Inventor: Johannes Ruoff, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 369 days.

(21) Appl. No.: 13/555,785

(22) Filed: Jul. 23, 2012

(65) Prior Publication Data

US 2012/0320358 A1   Dec. 20, 2012

Related U.S. Application Data

(63) Continuation of application No. PCT/EP2011/054084, filed on Mar. 17, 2011.

(60) Provisional application No. 61/318,880, filed on Mar. 30, 2010.

(30) Foreign Application Priority Data

Jun. 2, 2010   (DE) .......................... 10 2010 029 651

(51) Int. Cl.
*G03B 27/68*   (2006.01)
*G03B 27/32*   (2006.01)
*G03F 7/20*   (2006.01)

(52) U.S. Cl.
CPC ............ *G03F 7/70283* (2013.01); *G03F 7/705* (2013.01); *G03F 7/70566* (2013.01); *G03F 7/706* (2013.01)

(58) Field of Classification Search
CPC . G03F 7/70283; G03F 7/705; G03F 7/70566; G03F 7/706
USPC .......................................... 355/55, 77, 52, 67
See application file for complete search history.

(56) References Cited

U.S. PATENT DOCUMENTS

| 5,673,103 A | 9/1997 | Inoue et al. |
| 6,191,898 B1 | 2/2001 | Trunz et al. |
| 2002/0024714 A1 | 2/2002 | Sandstrom et al. |
| 2003/0063268 A1 | 4/2003 | Kneer et al. |
| 2003/0234918 A1 | 12/2003 | Watson |

(Continued)

FOREIGN PATENT DOCUMENTS

| CN | 1292102 A | 4/2001 |
| CN | 1530747 | 9/2004 |

(Continued)

OTHER PUBLICATIONS

International Search Report and a Written Opinion from the counterpart PCT Application No. PCT/EP2011/054084, dated Jun. 30, 20111.

(Continued)

*Primary Examiner* — Peter B Kim
*Assistant Examiner* — Michelle Iacoletti
(74) *Attorney, Agent, or Firm* — Fish & Richardson P.C.

(57) ABSTRACT

The disclosure relates to a method for adapting a projection exposure apparatus for microlithography to a mask having structures with different pitches and/or different structure widths in different structure directions. Wavefront aberrations induced by the mask are reduced by a manipulator of the projection exposure apparatus for microlithography.

24 Claims, 21 Drawing Sheets

(56) References Cited

U.S. PATENT DOCUMENTS

| | | |
|---|---|---|
| 2004/0137677 A1 | 7/2004 | Lowisch et al. |
| 2005/0088760 A1 | 4/2005 | Mann et al. |
| 2006/0008716 A1 | 1/2006 | Jeunink et al. |
| 2006/0083996 A1 | 4/2006 | Kim |
| 2006/0139611 A1 | 6/2006 | Wagner et al. |
| 2006/0152700 A1 | 7/2006 | Yamada |
| 2007/0046921 A1* | 3/2007 | Takahashi et al. ............ 355/71 |
| 2007/0154817 A1 | 7/2007 | Leunissen et al. |
| 2007/0165202 A1 | 7/2007 | Koehler et al. |
| 2008/0030706 A1* | 2/2008 | Yamamoto .................... 355/67 |
| 2008/0043236 A1 | 2/2008 | Kaise et al. |
| 2008/0151365 A1 | 6/2008 | Shafer et al. |
| 2008/0170310 A1 | 7/2008 | Mann |
| 2009/0034061 A1 | 2/2009 | Dodoc et al. |
| 2009/0086185 A1 | 4/2009 | Mori |
| 2009/0257032 A1* | 10/2009 | Eva et al. ....................... 355/30 |
| 2010/0183956 A1 | 7/2010 | Matsubara |
| 2011/0001947 A1 | 1/2011 | Dinger et al. |
| 2011/0080569 A1 | 4/2011 | Eva et al. |

FOREIGN PATENT DOCUMENTS

| | | |
|---|---|---|
| CN | 1722001 A | 1/2006 |
| CN | 101002300 A | 7/2007 |
| DE | 10 2005 034 991 A1 | 4/2003 |
| DE | 10 2009 016 063 A1 | 11/2009 |
| EP | 0 678 768 A2 | 4/1995 |
| EP | 0 851 304 A2 | 7/1998 |
| EP | 1 670 041 A1 | 6/2006 |
| EP | 1 795 967 | 6/2007 |
| EP | 1795967 A1 | 6/2007 |
| JP | 2004-179663 A | 6/2004 |
| JP | 2006-173305 A | 6/2006 |
| JP | 2007-165894 A | 6/2007 |
| TW | 200426522 A | 12/2004 |
| TW | 200628971 A | 8/2006 |
| TW | 200942983 A | 10/2009 |
| TW | 201009507 A | 3/2010 |
| WO | WO 2007/062794 | 6/2007 |
| WO | WO 2008/034636 | 3/2008 |
| WO | WO 2008/037496 | 4/2008 |
| WO | WO 2009/026970 | 3/2009 |
| WO | WO 2009/034109 | 3/2009 |
| WO | WO 2009/100856 | 8/2009 |

OTHER PUBLICATIONS

Yasushi Mizuno et al., Illumination Optics for Source-Mask Optimization, Proc. SPIE 7640, 764011 (2010).

Ruoff et al, Polarization-induced astigmatism caused by topographic masks, Proc SPIE 6730, 67301T (2007).

Erdmann et al, Mask diffraction analysis and optimization for EUV masks, Proceedings of the SPIE—The International Society for Optical Engineering 2009, vol. 7271.

Wim de Boeij et al., "Enabling the 45nm node by hyper-NA polarized lithography," Proc. SPIE Optical Microlithography XIX, vol. 6154, Mar. 15, 2006, pp. 1-11.

Korean Office Action, with translation thereof, for KR Appl No. 10-2012-7025419, dated Jun. 2014.

Chinese Office Action, with translation thereof, for CN Patent Application CN201180016812.X, mailed Apr. 8 2014.

Taiwanese Office Action, with translation thereof, for corresponding TW Appl No. TW100109849, received Sep. 24, 2013.

Japanese Office Action, with translation thereof, for JP Patent Application No. 2013-501741, dated Jul. 30, 2014.

Korean Office Action, with translation thereof, for KR Appl No. 10-2012-7025419, dated Nov. 26, 2014.

* cited by examiner

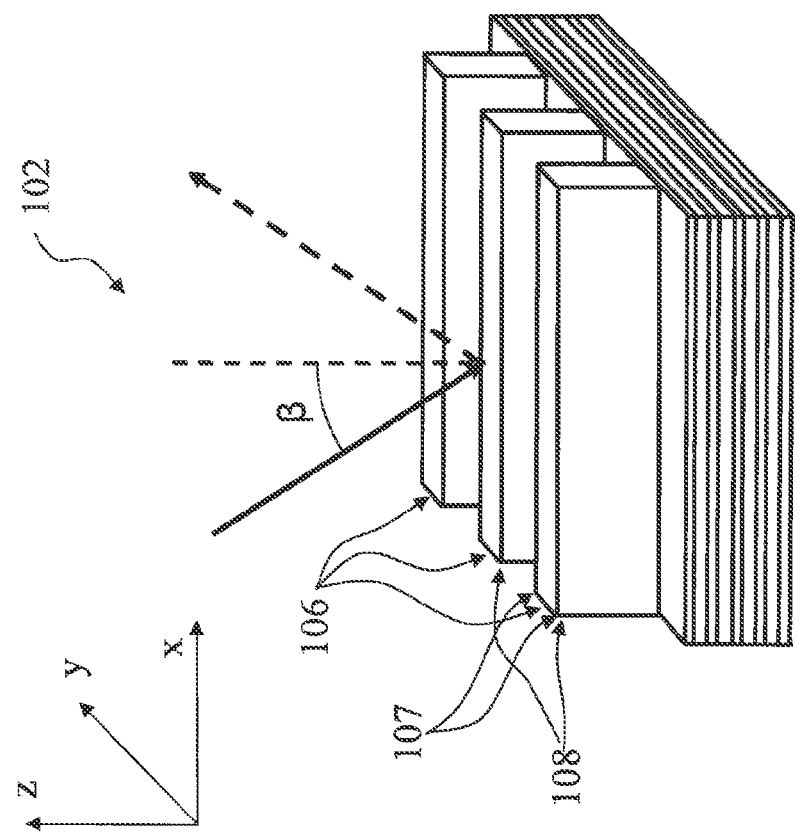
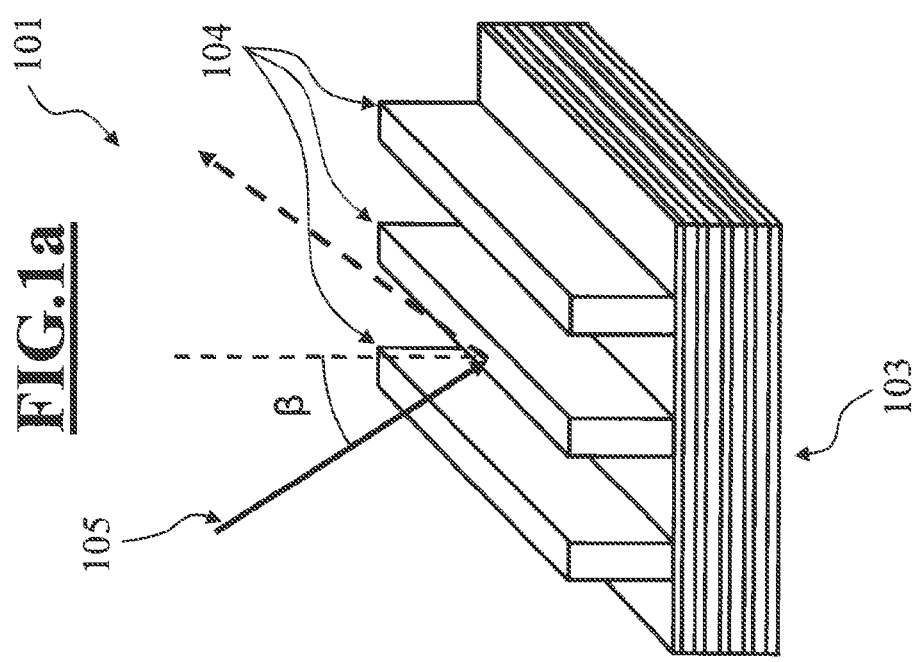
FIG. 1a

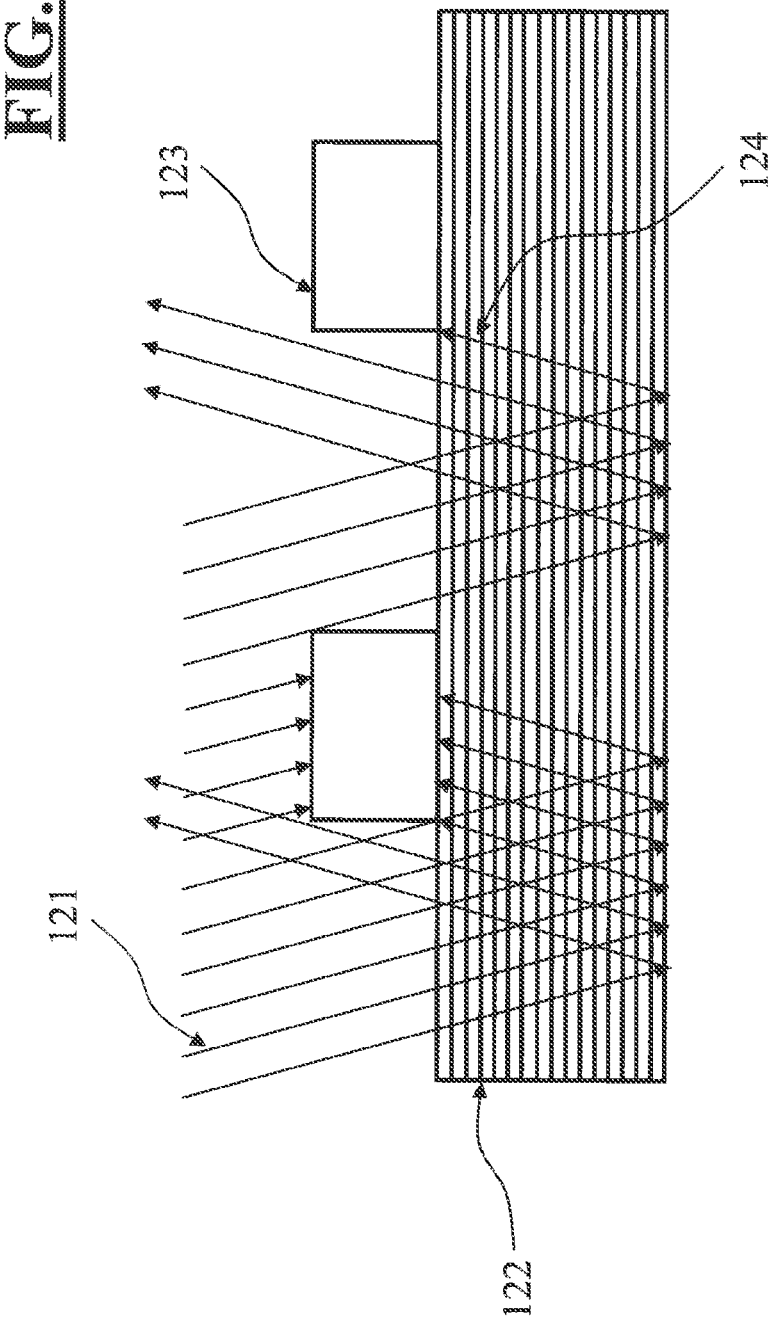

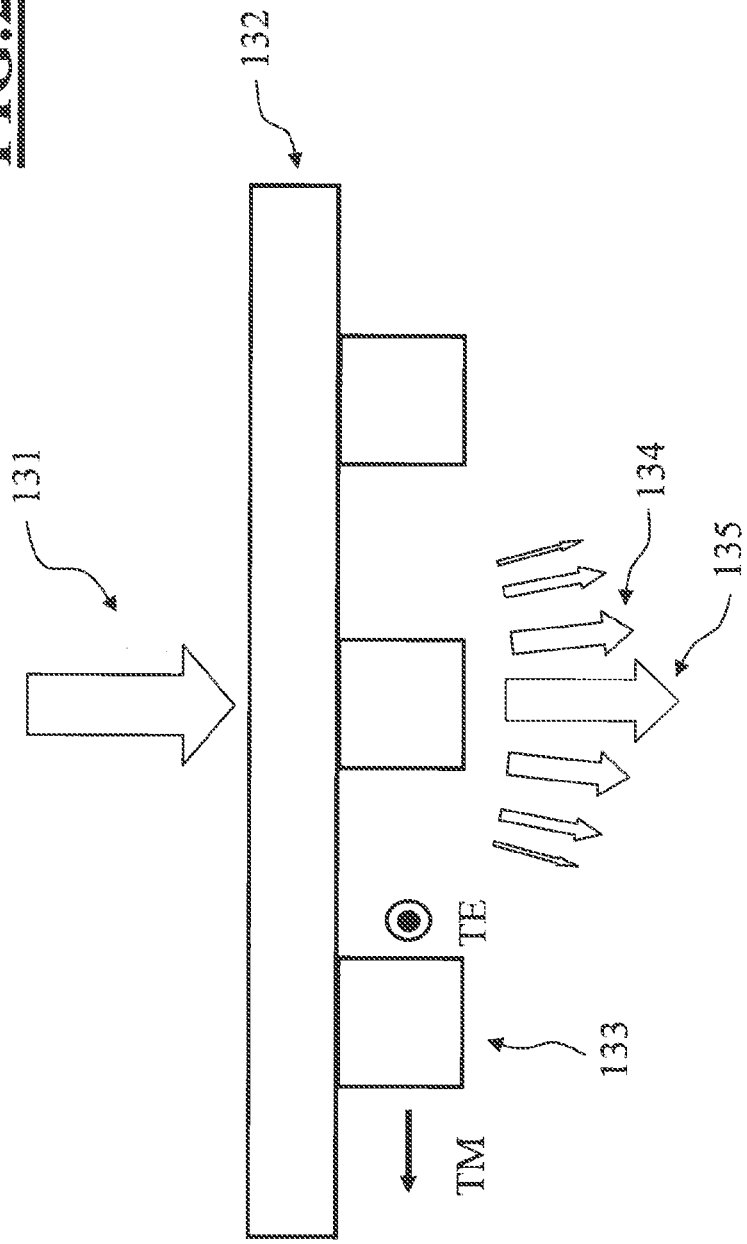

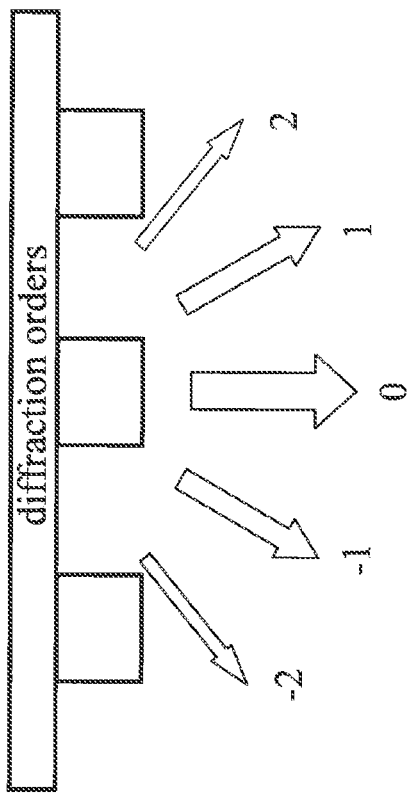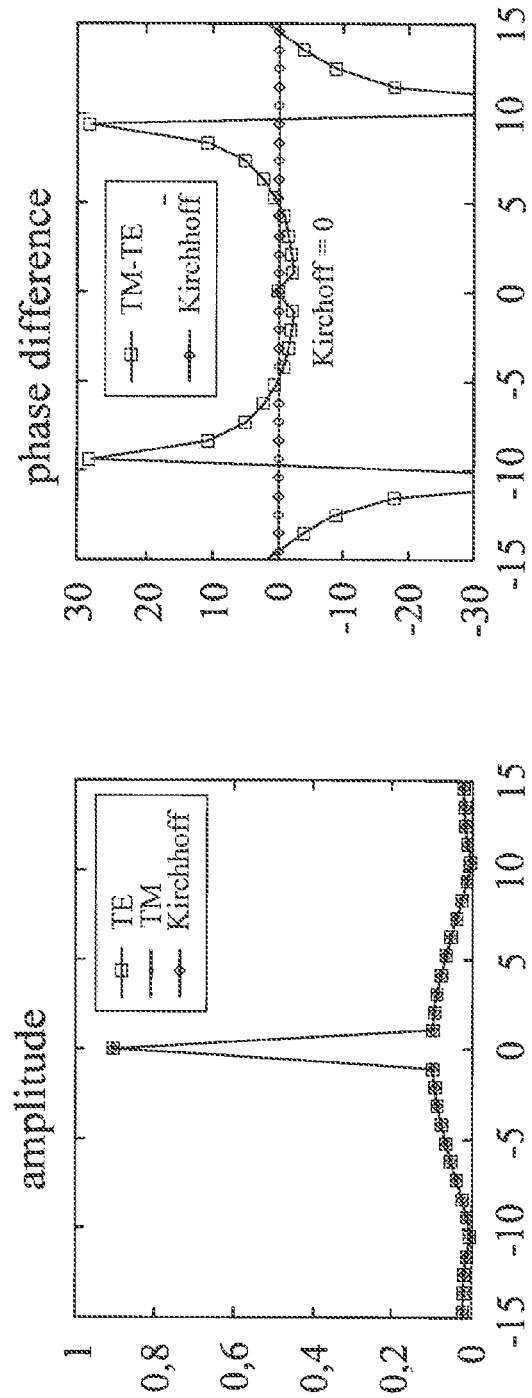
FIG. 2b

FIG. 5d

| | 45p90V | 90p350V | 90p350H |
|---|---|---|---|
| best focus non-compensated | 39.9 | 33.9 | 25.8 |
| best focus compensated | 0.0 | -2.0 | -0.4 |

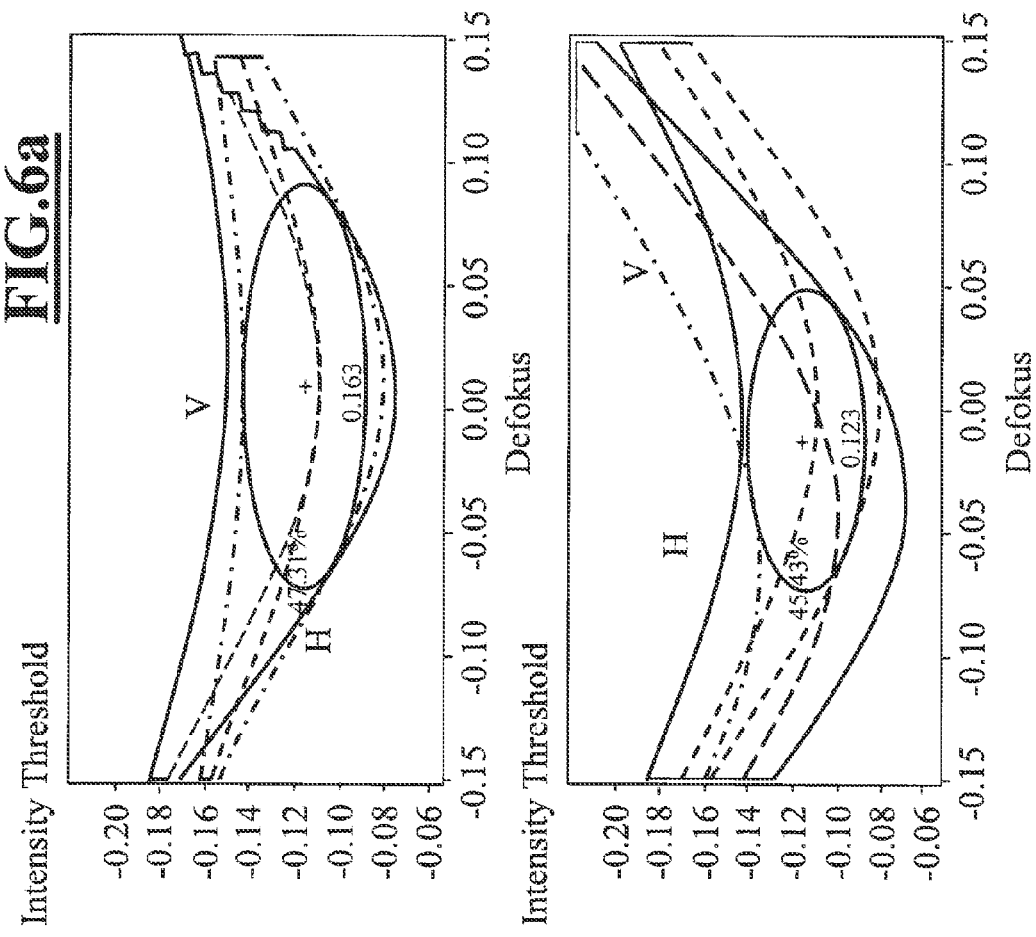

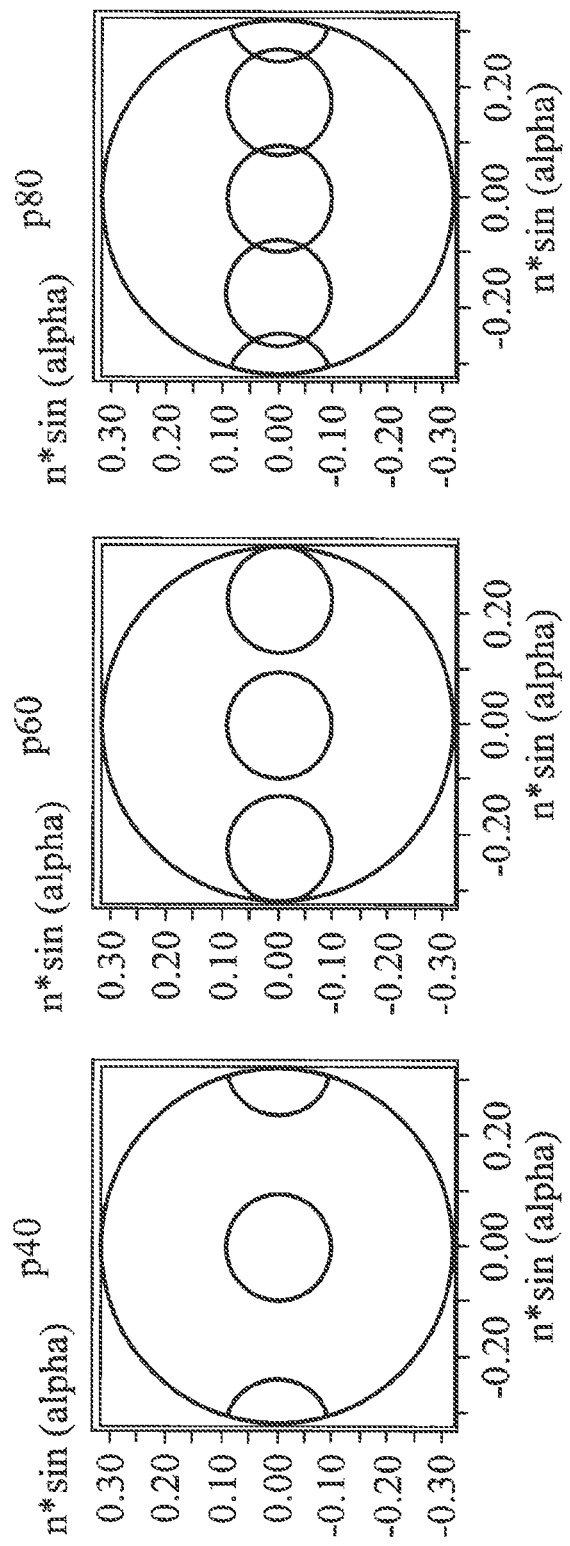

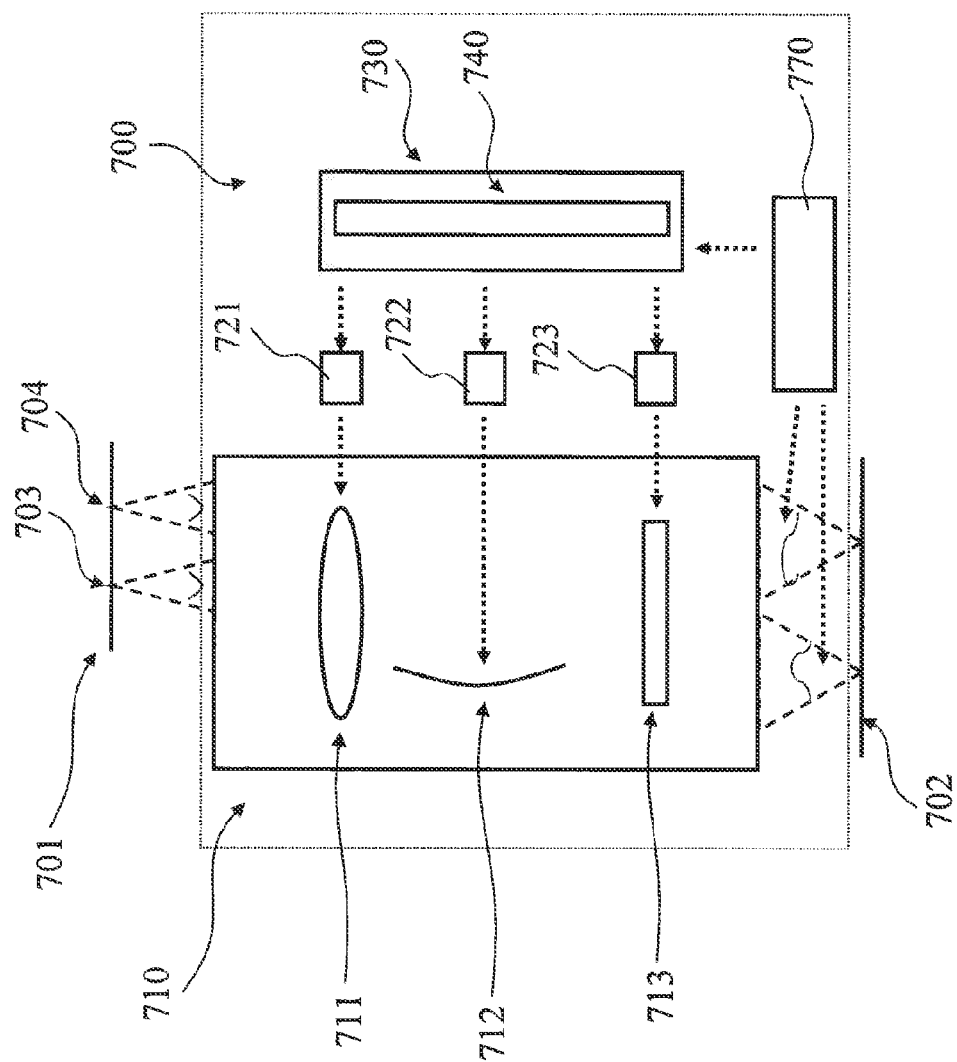

METHOD FOR OPERATING A PROJECTION EXPOSURE APPARATUS WITH CORRECTION OF IMAGING ABERRATIONS INDUCED BY THE MASK

CROSS-REFERENCE TO RELATED APPLICATIONS

This application is a continuation of, and claims benefit under 35 USC 120 to, international application PCT/EP2011/054084, filed Mar. 17, 2011, which claims benefit under 35 USC 119 of German Application No. 10 2010 029 651.1, filed Jun. 2, 2010 and under 35 USC 119(e) of U.S. Ser. No. 61/318,880, filed Mar. 30, 2010. International application PCT/EP2011/054084 is hereby incorporated by reference in its entirety.

FIELD

The disclosure relates to a method for adapting a projection exposure apparatus for microlithography, a method for operating a projection exposure apparatus for micro-lithography, and a projection exposure apparatus for microlithography which is equipped for carrying out these methods.

BACKGROUND

Projection exposure apparatuses for microlithography, hereinafter called projection exposure apparatuses, generally include: a light source; an illumination system, which processes the light rays emitted by the light source to form illumination light; an object to be projected, generally called a reticle or a mask; a projection objective, hereinafter called an objective, which images an object field onto an image field; and a further object onto which projection is effected, generally called a wafer. The mask or at least part of the mask is situated in the object field, and the wafer or at least part of the wafer is situated in the image field.

If the mask is situated completely in the region of the object field, and the wafer is exposed without a relative movement of wafer and image field, then the projection exposure apparatus is generally referred to as wafer stepper. If only part of the mask is situated in the region of the object field, and the wafer is exposed during a relative movement of wafer and image field, then the projection exposure apparatus is generally referred to as wafer scanner. The spatial dimension defined by the relative movement of reticle and wafer is generally referred to as scanning direction.

During the exposure of the wafer, the mask is illuminated with illumination light by the illumination system. The type of illumination is designated as a setting. A distinction is made between coherent illumination, incoherent illumination with a σ setting of between 0 and 1, annular illuminations, X- or Y-dipole settings with different, illuminated aperture angles, and quadrupole settings. Current development is tending in the direction of freeform illuminations, such as described, for example, in "Illumination Optics for Source-Mask Optimization, Yasushi Mizuno et al., Proc. SPIE 7640, 764011 (2010)". In this case, the intensity of the illumination light in the exit pupil of the illumination system can be set in any desired manner with a high spatial resolution.

For the integration density of the integrated circuit to be produced with the aid of the microlithographic exposure process, periodic structures can be very important. The structures are described by pitch and structure width. The structure width used on the wafer can be set freely to a certain degree by the resist threshold of the resist to be exposed. By contrast, the smallest achievable pitch, $Pitch_{min}$ is given by the wavelength of the illumination light and the object-side numerical aperture of the objective. The following holds true:

$$Pitch_{min} = \frac{\lambda}{NA(1+\sigma)}$$

for coherent and incoherent illumination with a predefined σ setting σ.

The structures on the mask to be imaged generally have two preferred directions. In the assessment of the imaging qualities of a projection exposure apparatus, therefore, a distinction is made at least between the maximally resolvable pitch of H (horizontal) and V (vertical) structures. In this case, hereinafter an H structure means a sequence of light-transmissive and light-opaque regions of the mask, wherein each individual one of the regions has its larger extent orthogonally with respect to the scanning direction.

The integration density ultimately achievable on the wafer in a projection exposure apparatus is substantially dependent on the following parameters: (a) depth of focus DOF of the objective, (b) image-side numerical aperture NA and (c) wavelength λ of the illumination light. Reliable operation of a projection exposure apparatus involves, for a desired critical dimension CD (that is to say the smallest structure width occurring on the wafer) and a given numerical aperture NA, the largest possible so-called process window formed from possible defocusing FV (focus variation) and variation of the dose of the illumination light. In this case, NA and DOF are anti-proportional. In order to reduce the critical dimension CD further, development is generally tending toward increasing numerical apertures NA. However, this leads to a reduction of the depth of focus DOF and thus to a reduction of the process window.

Therefore, it is desirable to increase or at least stabilize the process window in the context of a decreasing critical dimension CD.

Currently good resolutions of pitch and CD are achieved by two classes of projection exposure apparatuses.

The first class of projection exposure apparatuses is operated with an ArF laser at a wavelength λ of the illumination light of 193 nm with polarized light and works in immersion operation, that is to say with a liquid as last medium before the wafer, or in dry operation, that is to say with a gas as last medium before the wafer. The associated objectives that image the illuminated mask onto the wafer are generally dioptric or catadioptric objectives. The latter are operated with image-side numerical apertures of 0.8 or 1.3 or higher. By way of example, cf. US 20060139611A1, US 20090034061A1 or US 20080151365A1. The reticle is generally a glass substrate, and the structures of the reticle are defined by a structured layer composed of Cr, MoSi or other materials on the substrate.

The second class of projection exposure apparatuses is operated with a source of weak X-ray radiation (commonly referred to as EUV, extreme ultraviolet) at a wavelength λ of the illumination light of 13.5 nm. Such apparatuses are commonly referred to as EUV systems or EUV projection exposure apparatuses. The associated objectives that image the illuminated mask onto the wafer are catoptric objectives. The latter are operated with image-side numerical apertures of 0.2 to 0.35, 0.9 or higher, such as described, for example, in US 20050088760A1 or US 20080170031A1. The reticle is generally a glass substrate, such as ULE™ or Zerodur®, which becomes highly reflective through a stack of alternating Mo and Si layers in the case of light having a wavelength λ of 13.5 nm and the structures of the reticle are in turn defined by a structured Cr layer or else by a structured layer composed of TaN or other materials. The thickness of the structured layer is typically 50-70 nm.

The effects explained in "Polarization-induced astigmatism caused by topographic masks, Ruoff et al, Proc SPIE 6730, 67301T (2007)" occur in the first class of projection exposure apparatuses. Accordingly, the TM- and TE-polarized components of the illumination light respectively lead to different positions of the foci of H and V structures. Wavefront aberrations and in this case specifically astigmatism $Z_5$, $Z_6$ accordingly occur in the case of polarized illumination of a mask and subsequent imaging by the objective. The astigmatic terms $Z_5$, $Z_6$ are Zernike polynomials, the indexing of which follows fringe notation; cf. "Handbook of Optical Systems, Singer et al (eds.), Wiley-Vch, 2005". This is substantially associated with the failure of the Kirchhoff approximation upon the diffraction of the illumination light at the mask, which then appears three-dimensional for the light, in conjunction with a polarized illumination. The abovementioned article specifies a generalized Kirchhoff approximation that takes account of these effects. These effects, called rigorous in the technical jargon, are dependent on the structure widths, the material that defines the structures of the mask, such as Cr, for example, and the thickness of the structures in the direction of the beam path of the illumination light in the region of the mask.

Therefore, in this first class of projection exposure apparatuses, it is desirable to correct the structure- and pitch-dependent aberrations of the wavefront which are cause by the rigorous effects of the mask, and in particular, it is desirable to correct the structure- and pitch-dependent astigmatism induced by the mask.

In this case, the wavefront aberration induced by the structure or the structure width or the pitch or the induced aberration of the wavefront is understood hereinafter to mean the aberration that is caused exclusively by this structuring of the mask. To put it another way, this is the aberration that arises in addition to the other aberrations of the objective that are already present. Instead of an induced wavefront aberration of a pitch or of a structure width, reference shall also be made just to the wavefront aberration of the pitch or of the structure width.

In the second class of projection exposure apparatuses, the illumination of the mask takes place in reflection. Therefore, no telecentric illumination of the mask is possible since otherwise the illumination system and the objective would be in the way. The chief ray angle CRA, in the case of a projection exposure apparatuses in the first class, is the deviation of the chief ray from a telecentric ray. In the present case of a projection exposure apparatus in the second class, it is the angle of the chief ray of the illumination light with respect to an imaginary orthogonal relative to the object plane of the objective. In the case of a projection exposure apparatus as presented in US 20050088760A1, a CRA of 6° is used in the case of an image-side numerical aperture NA of 0.33. In the case of a projection exposure apparatus as presented in US 200801700310A1, a CRA of 15° in the case of an image-side numerical aperture NA of 0.5 is used. Generally, the CRA used increases with the numerical aperture NA of the objective.

For the effects described below, also cf. with "Mask diffraction analysis and optimization for EUV masks, Erdmann et al, Proceedings of the SPIE—The International Society for Optical Engineering 2009, vol. 7271".

As illustrated in a more detailed manner below, the CRA different from 0° results in shading of the reflected illumination light by the extent of the mask structures orthogonally with respect to the object plane of the objective. Therefore, here a purely topographical effect of the mask is present, which is determined by the geometrical, three-dimensional arrangement of illumination system, mask and objective. However, in contrast to the first class of projection exposure apparatuses, the effect also influences undiffracted illumination light.

This effect can no longer be disregarded, precisely for EUV projection exposure apparatuses, since the thickness of the structured layer on the mask is several wavelengths of the illumination light of λ=13.5 nm, and thus, in contrast to the first class of projection exposure apparatuses, which is operated at a wavelength of λ=193 nm, reference can be made to shadow casting.

If only undiffracted illumination light is considered, then this shading is manifested to a greater extent for H structures than for V structures if, for the design of illumination system and objective, it is assumed that the plane of incidence of the CRA on the mask is orthogonal to the extent of an individual structure of the H structures. The magnitude of the difference between the structure widths of H and V structures on the wafer, assuming identical structure widths on the mask, is dependent on the position thereof as an object point, considered in the object plane of the objective, as will be illustrated later. Therefore, H structures are generally imaged wider, depending on their position in the object plane of the objective. In addition, an image offset dependent on the position of the object point arises for H structures, which corresponds to a field-dependent tilt of the wavefront $Z_2$, $Z_3$. If the entire wavefront is analyzed, then the field-dependent distortion terms $Z_2$, $Z_3$, defocusing $Z_4$ and astigmatism $Z_5$, $Z_6$ arise as aberrations. These are accompanied by higher-order wavefront aberrations such as coma $Z_7$, $Z_8$ and secondary astigmatism $Z_{12}$, $Z_{13}$.

Therefore, in this second class of projection exposure apparatuses, too, it is desirable to correct the structure-width- and pitch-dependent aberrations of the wavefront which are induced by the rigorous effects of the mask, and, in particular it is desirable to correct the structure-width- and pitch-dependent astigmatism induced by the mask, of structure-width- and pitch-dependent distortion that is dependent on the position of the object point, and also of structure-width- and pitch-dependent focal position.

SUMMARY

The disclosure proposes, in a first approach (designated hereafter as "mask wavefront optimization" MWO), for the two classes of projection exposure apparatuses mentioned above, providing wavefront manipulation possibilities, or using already existing wavefront manipulation possibilities, to compensate for the effect mentioned above. These manipulations are intended to take into account a priori information about the structures of the mask, in particular the structure directions, pitches and structure widths thereof. In this case, a manipulation of the wavefront is understood to mean one which is performed in addition to other wavefront manipulation performed for correction purposes.

Projection exposure apparatuses are generally equipped with manipulation possibilities that ensure that the functionality of the apparatus is maintained over its lifetime. This is because, for example, the application of illumination light to the optical elements of the objective leads to the heating and degradation of the optical elements and hence to the alteration of the optical properties of the optical elements. The alteration of the optical properties generally leads to an impairment of the imaging performance of the objective and hence of the projection exposure apparatus. In particular, the process window is thereby reduced.

Therefore, some of the optical elements of the objective are equipped with manipulation possibilities that can globally or locally alter either their relative position with respect to other optical elements of the projection optical system or their form, in the case of a refractive optical element, their refractive index.

By way of example, in EP 678768A2 or in EP 1670041A1, the form of a lens is altered or the refractive index of the lens is altered by the application of heat, such that it exhibits an optical effect that deviates from its original effect. WO 2008037496A2 shows that, by introducing torques, it is also possible to achieve a form alterations of a lens which satisfies higher radial orders. In the case of a mirror, through the action of force on that side of the mirror which is removed from the illumination light, it is possible to achieve a more or less arbitrary form alteration of the mirror, such as described, for example, in US 20030234918A1. US 20090257032A1 and WO 2009026970A1 disclose manipulators which locally bring about the temperature and hence the refractive index and also the form of an optical element, in particular of a plane plate composed of quartz glass, via conductor tracks to which current is applied in the optical element.

EP 851304A2 provides a pair of aspherized plane plates, so called Alvarez plates, which exhibit no optical effect in a predefined spatial zero position with respect to one another, but which exhibit a previously calculated optical effect in the event of a translational relative movement with respect to one another. Furthermore, US 20030063268A1, and also U.S. Pat. No. 6,191,898B1 disclose the manipulation of optical elements in projection optical systems wherein the optical elements are displaced by manipulators in the direction of an optical axis or orthogonally with respect thereto, such that an optical effect is established by this relative movement with respect to further optical elements belonging to the projection optical system. WO 2007062794A1 discloses the manipulation of an optical element of a projection optical system wherein the projection optical system contains an optical axis. In this case, the optical element is moved in five spatial degrees of freedom: displacement in the direction of the optical axis, two displacements perpendicularly thereto, and two rotational movements about axes that do not correspond to the optical axis.

If the optical element on which one of the above manipulators acts is situated in a pupil plane of the objective, then the effect thereof on the wavefront of each field point of the image field is identical. If this is not the case, i.e. the optical element is not situated in a pupil plane of the objective, then the effect on the wavefront is generally field-dependent, i.e. the wavefront change induced by the manipulator is dependent on the field point considered. Therefore, in such a case, this is referred to a manipulator which acts in a field-dependent manner. In particular, with one of the above manipulators which acts on an optical element not arranged in a pupil plane of the objective, a field dependence of a wavefront aberration of the objective can be corrected.

The disclosure proposes, in a second approach (designated hereinafter as "source mask wavefront optimization" SMWO), manipulating the setting, i.e. the properties of the illumination light illuminating the mask, in addition to the manipulations of the wavefront. These manipulations are likewise intended to take into account a priori information about the structures of the mask, in particular the structure directions, pitches and structure widths thereof. In this case, a manipulation of the setting is understood to mean one which is performed as a change in addition to a setting of the illumination light that is possibly already carried out by the illumination system.

The illumination system of a projection exposure apparatus can be equipped with manipulation possibilities that permit annular settings, cf. for example with DE 102005034991A1, dipole or quadrupole settings, or US 20070165202A1, or a freeform illumination, cf. for example with WO 2009100856A1 or "Illumination Optics for Source-Mask Optimization, Yasushi Mizuno et al, Proc. SPIE 7640, 754011 (2010)."

The disclosure proposes, in a third approach (designated hereinafter as "source mask polarization wavefront optimization" SMPWO), also manipulating the polarization of the illumination light in addition to the manipulations of the wavefront and of the setting. These manipulations are likewise intended to take into account a priori information about the structures of the mask, in particular the structure directions, pitches and structure widths thereof. In this case, a manipulation of the polarization is understood to mean one which is performed in addition to a polarization of the illumination light which is possibly provided by the illumination.

The illumination system of a projection exposure apparatus can be equipped with manipulation possibilities that influence the polarization of the illumination light, cf. for example with DE 102009016063A1 or WO 2009034109A2.

The following configurations of the disclosure should not be regarded as restricting the disclosure. In particular, they can also be applied to projection exposure apparatuses that do not come under either of the two classes above. Although the rigorous mask effects are then less pronounced than in the two classes of projection exposure apparatuses discussed in a detailed manner above, they are nevertheless present. Furthermore, the disclosure is also applied to EUV systems with polarized illumination which lie in the intersection of the two classes above.

The following configurations of the disclosure should be understood as MWO, and they are numbered and denoted formulations for the sake of simplicity.

In a first formulation, the disclosure provides a method for adapting a projection exposure apparatus for microlithography to a mask having structures having different pitches and/or different structure widths in different structure directions. The projection exposure apparatus includes an illumination system for illuminating the mask with illumination light and for producing different illumination settings, and an objective for imaging the mask situated in the object plane of the objective onto a wafer situated in the image plane of the objective. The objective includes a manipulator having different manipulator deflections by which the wavefront of the imaging of the objective can be manipulated. The method includes defining a plurality of the different pitches and/or structure widths of the mask in different structure directions of the mask. The method also includes setting an illumination setting or a freeform illumination in the illumination system. The method further includes determining one of the manipulator deflections which reduces the wavefront aberrations caused by the defined pitches and/or defined structure widths. In addition, the method includes deflecting the manipulator into the manipulator deflection determined.

With such a method, a manipulator of the objective is deflected so that it not only corrects wavefront aberrations which are induced for example by positional, surface, or material tolerances of the optical elements of the objective or by heating of optical elements of the objective and which are therefore essentially independent of the structures on the mask to be illuminated. According to the superposition principle for the deflections of a manipulator, at least for this one manipulator, part of its deflection is used for compensating for rigorous mask effects. The projection exposure apparatus is thereby coordinated with a mask type or a class of masks. The definition of the pitches and/or structure widths is performed on the basis of the structures that are to be classified as particularly critical for the lithography process. The structures can be those which have a particularly small depth of focus DOF or have a geometry that is particularly critical to the functioning of the integrated circuit, or a combination of these two criteria is used for defining the pitches and/or structure widths.

In a second formulation, the disclosure provides a method for operating a projection exposure apparatus for microlithography. The projection exposure apparatus includes an illumination system for illuminating the mask with the illumination light and for producing different illumination settings, and an objective for imaging a mask situated in the object plane of the objective onto a wafer situated in the image plane of the objective. The objective includes a manipulator having different manipulator deflections, by which the wavefront of the imaging of the objective can be manipulated. The method includes providing a mask having structures having different pitches and/or different structure widths in different structure directions. The method also includes defining a plurality of the different pitches and/or structure widths of the mask in the different structure directions of the mask. The method further includes setting an illumination setting or a freeform illumination in the illumination system. In addition, the method includes determining one of the manipulator deflections which reduces the wavefront aberration caused by defined pitches and/or defined structure widths, and deflecting the manipulator into the manipulator deflection determined.

With a method according to the second formulation, a projection exposure apparatus that is not coordinated a priori with the mask that is currently to be illuminated is coordinated with a mask that is currently to be illuminated, as in the case of the 1st formulation.

In a third formulation, the disclosure provides a method for adapting a projection exposure apparatus for microlithography to a mask having structures having different pitches and/or different structure widths in different structure directions. The projection exposure apparatus includes an illumination system for illuminating the mask with the illumination light and for producing different illumination settings, and an objective for imaging the mask situated in the object plane of the objective onto a wafer situated in the image plane of the objective. The objective includes a manipulator having different manipulator deflections, by which the wavefront of the imaging of the objective can be manipulated. The method includes providing a mask, and setting an illumination setting or a freeform illumination in the illumination system. The method also includes determining the wavefront aberrations induced by the mask, and determining one of the manipulator deflections which reduces the wavefront aberrations determined. The method further includes deflecting the manipulator into the manipulator deflection determined.

A method according to the third formulation does not involve determining an individual or a few critical pitches and/or structure widths whose wavefront aberrations are intended to be compensated for by the manipulator. Rather, the entire wavefront aberration induced by the mask is reduced by the manipulator. In this case, the determination of the wavefront aberration induced by the mask is performed by a complete simulation of the mask under an assumed ideal imaging by an ideal objective. For this purpose, it is possible to use the Tachyon™ platform from Brion, for example, which can be used to calculate such a simulation.

In a fourth formulation, the disclosure provides a method according to the first formulation or the second formulation, in which: a first of the structure directions of the mask is defined; two different pitches P1 and P2 of the different pitches or two different structure widths S1 and S2 of the different structure widths of the first structure direction are defined; the wavefront aberration of the different pitches P1 and P2 or of the different structure widths S1 and S2 is determined; and a first manipulator deflection M1 which reduces the wavefront aberration of pitch P1 or of the structure width S1 is determined. In the case where the wavefront aberrations of the pitches P1 and P2 or of the structure widths S1 and S2, respectively, are different, a second manipulator deflection M2 is determined which reduces the wavefront aberration of pitch P2 or of the structure width S2, and a relative weighting $\alpha \epsilon [0,1]$ of the pitches P1 with respect to P2 or of the structure widths S1 and S2 is defined, and the manipulator is deflected by the value $\alpha M1+(1-\alpha)M2$. In the case where the wavefront aberrations of the pitches P1 and P2 or of the structure widths S1 and S2, respectively, are not different, the manipulator is deflected by the value M1.

With a method according to the fourth formulation, the correction of the wavefront is made dependent on the pitches or the structure widths. With the weighting $\alpha$ it is possible to ensure that of the pitches critical for the function of the integrated circuit that is ultimately to be produced, or of the critical structure width, the wavefront is corrected as well as possible. In comparison with a structure-independent correction of the wavefront, this ultimately produces fewer rejects in the production of the integrated circuit.

In a fifth formulation, the disclosure provides a method according to the first formulation or the second formulation, in which: a first of the structure directions of the mask is defined; a second, different than the first, of the structure directions of the mask is defined; a pitch or a structure width is defined which occurs in the first and also in the second structure direction of the mask; the wavefront aberrations of the pitch or of the structure width for the first structure direction and also for the second structure direction are determined; and a first manipulator deflection M1 which reduces the wavefront aberration of the pitch or of the structure width of the first structure direction is determined. In the case where the wavefront aberrations of the pitch or of the structure width for the first structure direction and for the second structure direction are different, a second manipulator deflection M2 is determined which reduces the wavefront aberration of the pitch or of the structure width of the second structure direction, and a relative weighting $\alpha \epsilon [0,1]$ of the structure directions is defined and the manipulator is deflected by the value $\alpha M1+(1-\alpha)M2$. In the case where the wavefront aberration of the pitch or of the structure width for the first structure direction and for the second structure direction is not different, the manipulator is deflected by the value M1.

With a method according to the fifth formulation, the correction of the wavefront is made dependent on the structure direction. With the weighting, it is possible to ensure that structure direction critical for the function of the integrated circuit that is ultimately to be produced, the wavefront is corrected as well as possible. In comparison with a structure-direction-independent correction of the wavefront, this produces fewer rejects in the production of the integrated circuit.

In a sixth formulation, the disclosure provides a method according to the first formulation or the second formulation, in which: the manipulator is arranged in a pupil plane of the objective; the manipulator can influence the phase of the wavefront in a spatially resolved fashion up to δ times the pupil diameter for a δ∈[0,0.5]; a first of the pitches or a first of the structure widths is fixed; an n-th diffraction order of the first pitch or of the first structure width is fixed; a second of the pitches or a second of the structure widths is fixed; an m-th diffraction order of the second pitch or of the second structure width is fixed; such that the n-th diffraction order of the first pitch or of the first structure width and the m-th diffraction order of the second pitch or of the second structure width are spaced apart from one another by at least δ times the pupil diameter; the wavefront aberrations of the first pitch or of the first structure width and the wavefront aberrations of the second pitch or of the second structure width are determined; a first manipulator deflection M1 is determined which reduces the phase error of the wavefront aberration of the first pitch or of the first structure width at the location of its n-th diffraction order and which leaves the phase of the wavefront invariant at the other locations of the pupil; a second manipulator deflection M2 is determined which reduces the phase error of the wavefront aberration of the second pitch or of the second structure width at the location of its m-th diffraction order and which leaves the phase of the wavefront invariant at the other locations of the pupil; and the manipulator is deflected by the value M1+M2.

The spatial resolution of the phase of the wavefront by the manipulator up to δ times the pupil diameter is to be understood herein to mean the following: for the case where the pupil diameter is 1, the phase at in each case two points of the pupil which have at least the distance δ can be influenced by the manipulator at the first of the two points independently of the second of the two points. In the case of a pupil diameter not equal to 1, the scaling with the pupil diameter is correspondingly effected. In other words: the manipulator acts locally on the phase of the wavefront and leaves the phase invariant at other locations. Such manipulators are disclosed for example in US 20090257032A1 and WO 2009026970A1. In this case, the invariance should not necessarily be understood to mean a 100% invariance. Manipulators which can influence the phase of the wavefront by a value φ at any desired location of the pupil and influence the phase by not more than 0.1·φ or even not more than 0.05·φ in this case at any other point of the pupil are also intended to be understood as spatially resolving within the meaning above. Such manipulators are disclosed, for example, in WO 2008037496A2 and US 20030234918A1.

A method according to the sixth formulation makes use of the fact that the diffraction orders of different pitches or of different structure widths can be spaced apart spatially in a pupil plane of the objective. Generally, a fixedly chosen diffraction order m is given by a set of locations of the pupil. For conventional illumination σ=0, this is a one-point set and, for increasing σ, there are circles with increasing radius. The distance between a first and a second diffraction order is then defined by the minimum distance between a first point from the first diffraction order and a second point from the second diffraction order. The position and the distance of individual diffraction orders are dependent on the σ setting, the structure widths, the pitch and the objective and can therefore be determined before the projection exposure apparatus is started up. For non-conventional illumination, such as, for example, dipole or quadrupole illumination, the fact of whether or not the diffraction orders are spaced apart is dependent on the relative orientation of the structure direction with respect to the poles and also the extent thereof. In the case of annular illumination, the sixth formulation is generally not employed, since the diffraction orders in this case are as a rule no longer spaced apart. Accordingly, in this or some other pupil plane it is possible to provide a manipulator which can correct the phase aberrations of the wavefront which are induced by the respective pitches or structure widths in the region of a respectively fixedly chosen diffraction order separately from one another. This presupposes that the manipulator can perform the correction of the wavefront of the pupil with a spatial resolution which is sufficient for this purpose. Since precisely the pitches or structure widths situated in the vicinity of the resolution limit of the objective are the most critical for the lithographic process, for example in the production of flash memories involving a high integration density, an aberration-free interference of the lower and, in particular, of the second to fifth diffraction orders is of crucial importance. This is ensured by the method according to the sixth formulation.

The methods according to one of the formulations from the fourth formulation to sixth formulation can also be carried out in a combined fashion by different pitches or structure widths of different structure directions being examined with regard to the wavefront aberrations and a weighting being performed. In a general approach, the method is carried out for a finite set of m pitches that are different in pairs, n structure widths that are different in pairs, l different structure directions. In this case, a total of l(m+n) wavefront aberrations are determined and $\alpha_1, \ldots, \alpha_{l(m+n)}$ weights where $\Sigma_{i=1}^{l(m+n)} \alpha_i = 1$ are defined. Since the structure direction affects the rigorous mask effects only purely geometrically, l=2 generally suffices since the effects of structure directions other than H and V can be derived analytically from those of H and V.

In a seventh formulation, the disclosure provides a projection exposure apparatus for microlithography, which includes an illumination system for illuminating a mask with the illumination light and for providing different illumination settings or a freeform illumination, and an objective for imaging a mask situated in the object plane of the objective onto a wafer situated in the image plane of the objective. The objective includes a manipulator having different manipulator deflections, by which the wavefronts of the imaging of the objective can be manipulated. The projection exposure apparatus includes a controller for controlling the manipulator. The controller includes a memory for storing an assignment table which assigns manipulator deflections to a set of different pitches and/or structure widths.

A projection exposure apparatus according to the seventh formulation can either be adapted to a mask or a class of masks according to a method according to the first formulation or can be operated according to a method from the second formulation. Since the adaptation according to a method of the first formulation or the operation according to a method of the second formulation merely involves information about the structures and pitches of the mask, the manipulator deflection that is to be deflected is likewise only dependent thereon. Accordingly, it is possible to store an assignment of pitches and structure widths to manipulator deflections in the form of a look up table stored in a memory of the controller.

The following configurations of the disclosure should be understood as SMWO, and they are furthermore numbered consecutively for the sake of simplicity.

In an eight formulation, the disclosure provides a method for adapting or for operating a projection exposure apparatus for microlithography to a mask having structures having different pitches and/or different structure widths in different structure directions according to any of the first, second, fourth or fifth formulations, in which: in addition to a manipulator deflection, a change in the illumination setting or a change in the freeform illumination is determined, such that, by virtue of the change in the illumination setting or the change in the freeform illumination and deflection of the manipulator with the manipulator deflection, the wavefront aberrations caused by the different pitches and/or different structure widths are reduced at least to the same extent as in the method according to the first formulation.

With a method according to the 8th formulation, the aberration of the wavefront which is induced by the different pitches and/or different structure widths is not only reduced with the aid of the manipulator, rather the setting is additionally used as a degree of freedom for correcting the wavefront. A correction of the wavefront which is at least not worse and in many cases is better is achieved as a result. By way of example, in the case of a dipole setting this can achieved by virtue of the fact that a better separation of the diffraction orders in the pupil is achieved by a narrowing of the width of the poles. The method according to the 5th formulation can then be performed for pitches from an a priori larger set of pitches.

In a ninth formulation, the disclosure provides a projection exposure apparatus for microlithography according to the seventh formulation, which includes: a manipulator of the illumination system, by which the illumination setting or the freeform illumination can be changed; the second manipulator is controllable by the controller; and the controller includes a memory for storing an assignment table which assigns illumination settings or freeform illuminations to a set of different pitches and/or structure widths.

A projection exposure apparatus according to the ninth formulation can either be adapted to a mask or a class of masks or be operated according to the method according to the eighth formulation. Since the adaptation or the operation according to the eighth formulation merely involves information about the structures and pitches of the mask, the manipulator deflection that is to be deflected and the change in the setting or the freeform illumination to be set are likewise only dependent thereon. Accordingly, it is possible to store an assignment of pitches and structure widths to manipulator deflections and the setting or the freeform illumination in the form of a lookup table, stored in a memory of the controller.

The following configurations of the disclosure should be understood as SMPWO, and they are furthermore numbered consecutively for the sake of simplicity.

In a tenth formulation, the disclosure provides a method for adapting or for operating a projection exposure apparatus for microlithography to a mask having structures having different pitches and/or different structure widths in different structure directions according to any of the first, second, fourth, fifth, sixth or eighth formulations, in which: in addition to a manipulator deflection and the change in the illumination setting or the change in the freeform illumination, a change in the polarization of the illumination light is determined, such that by virtue of the change in the illumination setting or the change in the freeform illumination and deflection of the manipulator with the manipulator deflection and change in the polarization of the illumination light, the wavefront aberrations caused by the different pitches and/or different structure widths are reduced at least to the same extent as in a method according to eighth formulation.

With a method according to the tenth formulation, the aberration of the wavefront which is induced by the different pitches and/or different structure widths is not only reduced with the aid of the manipulator and the setting or the freeform illumination, rather the polarization of the illumination light is additionally used as a degree of freedom for correcting the wavefront. A correction of the wavefront which is at least not worse and in many cases is better, is achieved as a result.

In an eleventh formulation, the disclosure provides a method according to any of the preceding formulations, in which the objective includes a further manipulator which corrects a field dependence of the wavefront aberration.

In a twelfth formulation, the disclosure provides a projection exposure apparatus for microlithography according to any of the preceding formulations, in which: the objective includes a further manipulator, which is not located in a pupil plane of the objective; the further manipulator is controllable by the controller; and the controller includes a memory for storing an assignment table which assigns deflections for the further manipulator to a set of different pitches and/or structure widths.

BRIEF DESCRIPTION OF THE DRAWINGS

The disclosure is explained on the basis of the following exemplary embodiments with their accompanying drawings, in which:

FIGS. 1a through 1c illustrate the arising of the rigorous effects at a mask in the case of a CRA >0';

FIGS. 2a through 2b illustrate the arising of the rigorous effects at a mask in the case of polarized illumination;

FIG. 5d shows the position of the best foci for three structures without and with compensating wavefront;

FIG. 6a shows the process window reduction resulting from the displacement of the focus of a V structure relative to an H structure;

FIG. 6b shows the position of diffraction orders of different pitches in a pupil of the objective;

FIG. 7 shows an objective of a projection exposure apparatus for microlithography with manipulators;

DETAILED DESCRIPTION

Figure 1B:
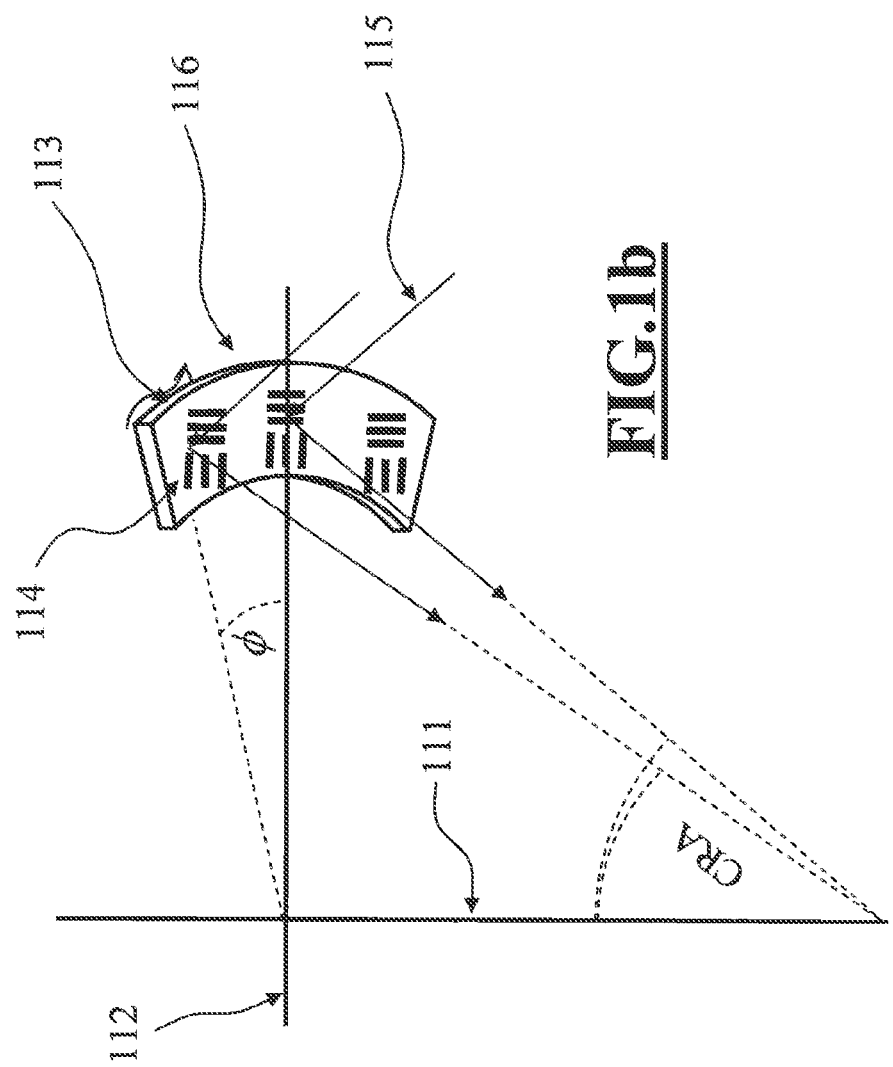

FIGS. 1a and 1b show the arising of the rigorous effects at a mask which is crucial for the second class of projection exposure apparatuses described above.

FIG. 1a shows the arising of a rigorous effect at a mask in the case of a CRA of greater than 0°. The left-hand illustration 101 shows the incidence of the illumination light in the case of an H structure 104 of the mask, which is illustrated three-dimensionally here. The H structure is situated on a carrier 103, which is highly reflective to the wavelength of the illumination light λ=13.5 nm and which consists of alternating Mo and Si layers. The dimension orthogonal to the surface of the carrier is designated here by z which corresponds to the dimension in which the thickness of the H structures 104 consisting of chromium Cr is approximately 60 nm. The H structures have a larger extent in the y-direction than in the x-direction. If a ray of illumination light 105 impinges on the mask at an angle β>0°, e.g. β=6° or β=15° relative to the direction z, then a shading effect occurs for the reflected ray, illustrated as interrupted here. This effect does not occur in the case of the V structure 106, illustrated in the right-hand illustration 102.

The structure width of a structure, for example of the V structure 106 in the right-hand illustration, is here its extent 107 in the y-direction. The pitch is the distance between two V structures, here illustrated as 108 in the y-direction.

FIG. 1b shows the field dependence, i.e. the dependence on the position of the structures to be imaged in the image field of the objective, the position of the H structures 113 and V structures 114 in the case of a CRA >0° with respect to the orthogonal 111 relative to the object plane 112. Only at an azimuth angle φ=0°, corresponding to the illustration from FIG. 1a, does the incident illumination light 115 see the structures as illustrated in FIG. 1a. At an azimuth angle of φ>0° with respect to the scanning direction, the illumination light 115 assumes two angles, CRA and the azimuth angle φ. In FIG. 1b, 116 is a three-dimensional illustration of the mask which lies in the object plane of the objective. 112 merely shows one dimension of the object plane; to be precise, the latter 112 is the scanning direction of the projection exposure apparatus.

FIG. 1c illustrates the shading effect from a point of view within the object plane of the objective. Illumination light 121 is incident from the left-hand side on the layer stack 122 and is reflected in the latter, and it can be discerned that, at the right-hand structure 123, a shading 124 arises which is likewise of purely geometrical nature and is dependent on the effective location of the reflection of the illumination light in the layer stack.

FIG. 2a shows the arising of the rigorous effects at a mask which is crucial for the first class of projection exposure apparatuses described above. Incident illumination light 131 is diffracted into diffraction orders 134, 135 by Cr structures 133 arranged on a mask carrier 132. The individual polarization directions TE and TM are defined on the basis of the structure direction. The electric field vector of the illumination light oscillates parallel to the structure direction in the case of TE polarization and perpendicular thereto in the case of TM polarization. For the Kirchhoff approximation, the phase difference between zeroth and higher diffraction orders is zero or at least constant. Aberrations arise if the higher diffraction orders in each case have an individual phase difference in comparison with the zeroth diffraction order. Therefore, no aberrations induced by the mask are to be expected within the Kirchhoff approximation. Upon rigorous calculation, such individual phase differences of the higher diffraction orders occur, which can additionally be different for TE and TM. Since H and V lines, given the same illumination polarization, e.g. orthogonally with respect to the scanning direction, "see" sometimes TE and sometimes TM, these phase differences are different. Such a polarization is TE-polarized for H lines, and correspondingly TM-polarized for V lines. Therefore, the two structures induce different aberrations, such as different focus shifts, which ultimately has an effect as astigmatism.

FIG. 2b quantitatively illustrates the effect from FIG. 2a. In the two graphs, the individual diffraction orders of the illumination light are listed on the abscissa. In the left-hand graph, the relative amplitudes of the individual diffraction orders, relative to the incident amplitude, are illustrated on the ordinate. No difference is established between unpolarized light (designated as "Kirchhoff" in the figure), TE polarization and TM polarization. The right-hand graph illustrates the TM to TE phase differences in nanometers. A significant difference between TE and TM can be discerned here. The determined values of the two graphs were calculated for a coherent illumination with a normal direction of incidence on the mask for a structure width of 200 nm given a pitch of 2000 nm.

Figure 3:
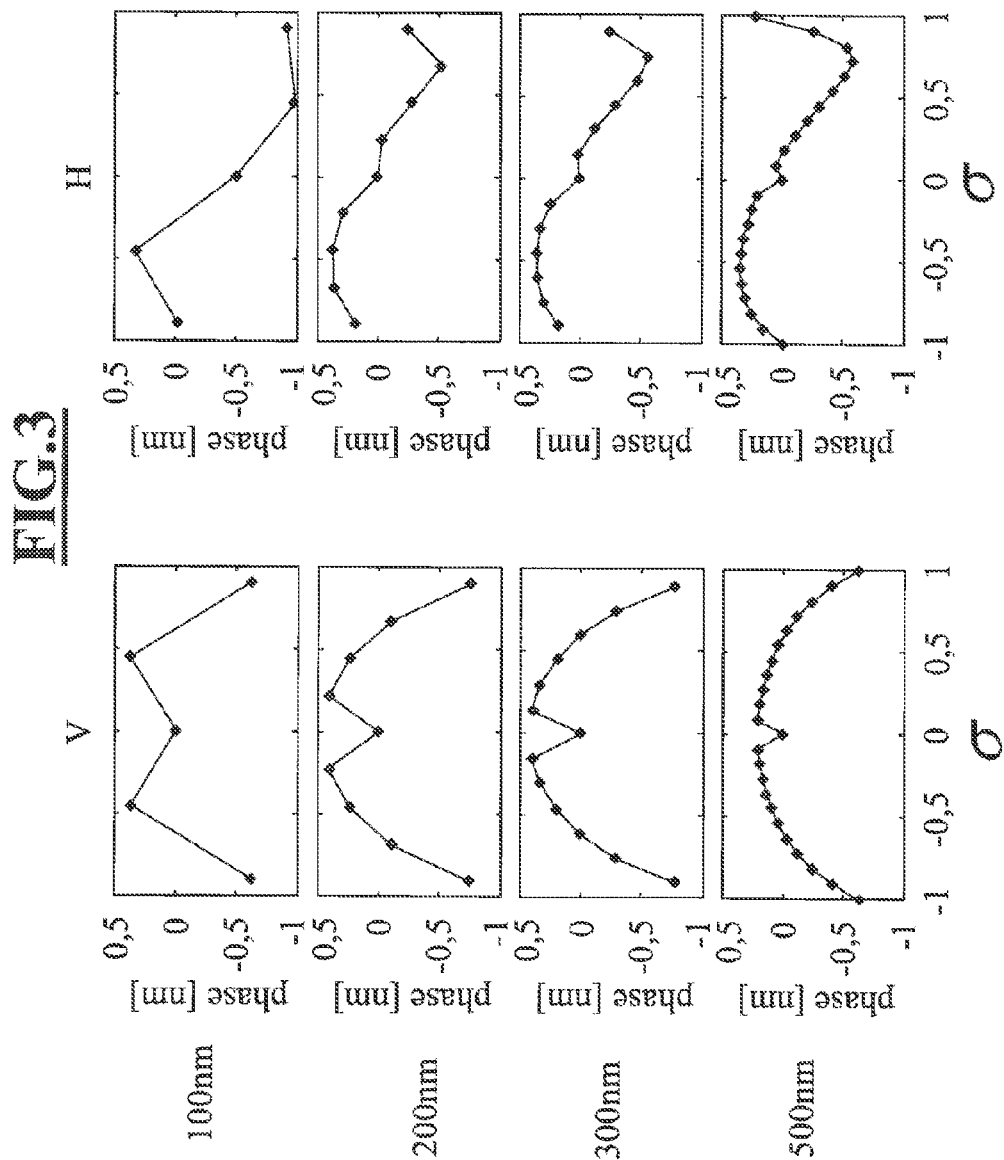
FIG. 3 shows the phase errors for H and V structures with different pitches.

FIG. 3 illustrates, for an EUV projection exposure apparatus in the above-described second class of projection exposure apparatuses, second the phase errors for H and V structures such as are illustrated in FIG. 1b. The abscissa σ varies between −1 and 1 and indicates the normalized pupil coordinate in the entrance pupil of the objective. The ordinate indicates the phase error in nm, relative to the 0-th diffraction order, σ=0. The pitches 100 nm, 200 nm, 300 nm and 500 nm are compared. It can readily be discerned that, for the lowest pitch of 100 nm, only the diffraction orders −2, −1, 0, 1, 2 pass through the objective. The phase of the wavefront corresponds for V structures in terms of its radial component to an even function and has for each pitch two points of inflection in each case. Since the diffraction orders for small pitches, in comparison with larger pitches, lie further toward the outside in the pupil, the points of inflection there also lie further toward the outside. In the case of a pitch of less than 100 nm (not illustrated here), the case can occur in which only the diffraction orders −1, 0, 1 pass through the objective. The phase of the wavefront of such a pitch then no longer has any points of inflection at all. Overall, the phase errors of the wavefront can be expanded into the Zernike polynomials $Z_4$, $Z_9$, . . . and generally $Z_i$ with quadratic i. The phase errors of the H structures also experience, in addition to the phase errors of the V structures, a tilting, $Z_2$, $Z_3$ and higher-order terms such as $Z_7$, $Z_8$ . . . .

For each pitch, the phase of the wavefront can be corrected by a manipulator according to any of the formulations 1st formulation, 2nd formulation or 3rd formulation to 6th formulation. In this case, it is advantageous if the manipulator, as in the 6th formulation, is situated in a pupil plane of the objective. In the case of the simultaneous, possibly weighted correction of a plurality of pitches according to the 4th formulation, a spatially resolving manipulator according to the 6th formulation is advantageous since the wavefront resulting from the superposition of the phase errors of the individual pitches has a priori a multiplicity of points of inflection in its radial component.

Figure 4:
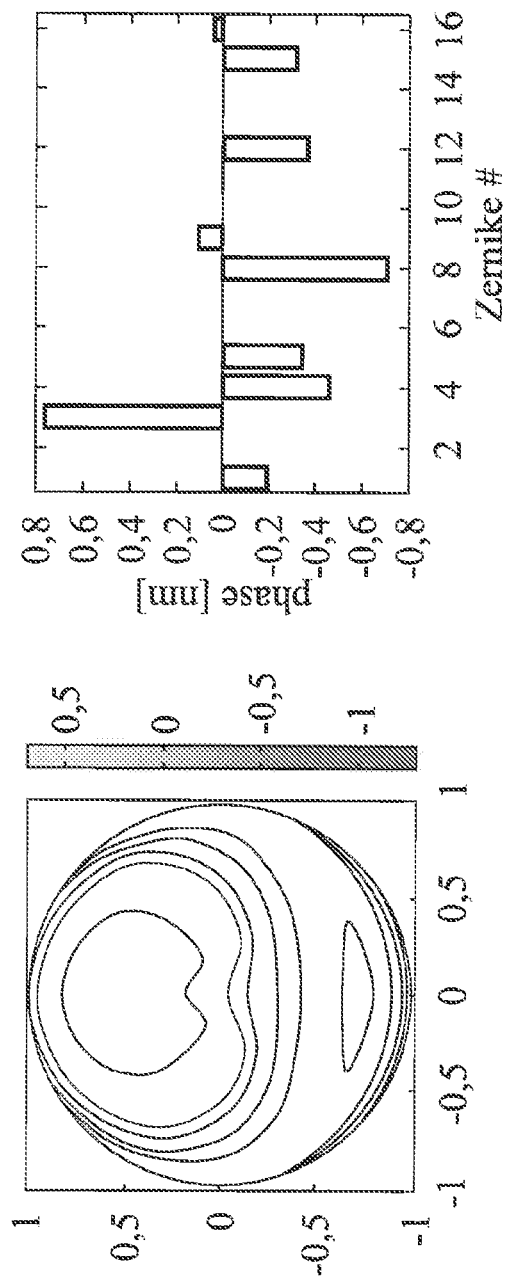
FIG. 4 shows the summed wavefront aberration over different structure directions.

In FIG. 4, the common phase error of a plurality of structures of the mask, which are assumed to be uniformly distributed with regard to their azimuth, is superposed. In the left-hand illustration, the superposed phase error of the normalized pupil coordinate in the entrance pupil of the objective is illustrated. The latter is expanded into Zernike polynomials in the right-hand illustration. It emerges that such a complex pupil profile can advantageously be corrected by a spatially resolving manipulator according to the 6th formulation.

The above illustration applies to a fixedly chosen object point of the object field of the objective and similar illustrations can be derived for other object points. Therefore, these illustrations should be understood as location-dependent on the object point to be imaged. To put it another way, the wavefront aberration induced by the different pitches has a field profile and the latter is advantageously corrected by a second manipulator according to the 12th formulation, which is not located in a pupil plane of the objective.

As already illustrated above, terms that influence the focus are primarily found in the wavefront aberration induced by the different pitches. In this respect, cf. the phase profiles from the first column in FIG. 3 which are all an even function and thus correspond to a phase error of the pupil which is rotationally symmetrical.

The focus proves not only to be pitch-dependent, but it is also dependent on the structure width to be imaged.

Figure 5A:
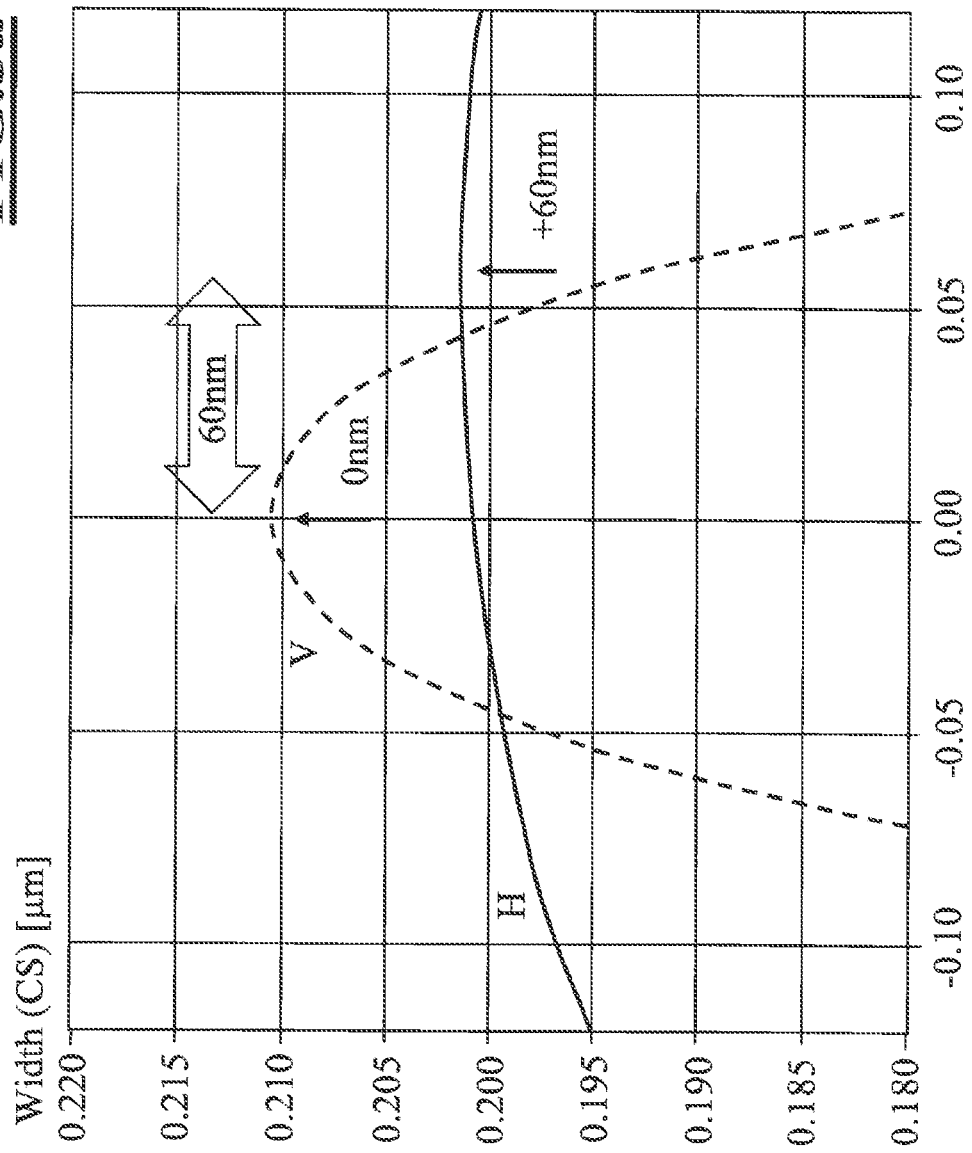
FIG. 5a shows the displacement of the best focus of a V structure relative to an H structure.

FIG. 5a shows the comparison of the best focus location associated to a V structure with the best focus location associated to a H structure accompanying the imaging of an isolated structure having a width of 200 nm and making use of polarized illumination. The abscissa as well as the ordinate are given in micrometers. The origin of the abscissa is defined to be the point where the width of the image of the V structure is maximal. The dashed graph illustrates the width decrease of the image of the V structure if the image plane is defocused. The continuous graph illustrates the width decrease of the image of the H structure if the image plane is defocused. The maximal width of the image of the H structure is located at a defocus of +60 nm with respect to the location where the width of the image of the V structure is maximal. Since at these two maxima the derivatives of the dashed graph and of the continuous graph vanish, these two maxima are the best focus locations to image the V structure and the H structure, respectively. Apparently those two best locations differ by 60 nm.

FIGS. 5b to 5f give a further example of best focus locations associated by different structures, orientations, pitch sizes and show measures to reduce the differences between these locations.

Figure 5B:
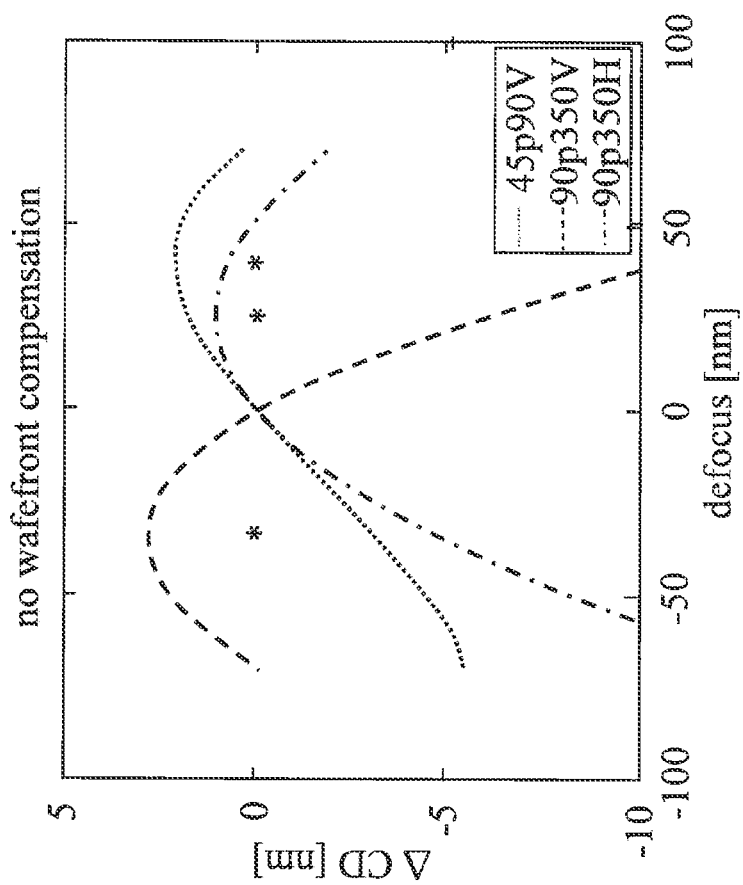
FIG. 5b shows an example of the relation of defocus and critical dimension for three structures without compensating wavefront.

FIG. 5b shows three Bossung curves, i.e. three graphs of the variation of the line width (critical dimension CD) as functions of defocus for three given structures: 45 nm V structures with pitch size of 90 nm, graph 45p90V, 90 nm V structures with pitch size 350 nm, graph 90p350V, and 90 nm H structures with pitch size 350 nm, graph 90p350H. The variation of the critical dimension $\Delta CD$ relative to a defocus as shown in FIG. 5b is calculated for a VUV projection optics having an image side numerical aperture of NA=1.35, and a wavelength of illumination light of 193 nm. The illumination setting is a y-polarized partially coherent setting with a partial coherence factor $\sigma$=0.2 C.f. Alfred Kwok-Kit Wong "Resolution Enhancement Techniques in Optical Lithography", SPIE Press, Bellingham Wash., 2001 for technical details of illumination settings. The three structures are given by an alternating phase shift mask having its opaque sections given by a 100 nm Cr-layer and an etch depth of 192 nm. The resist threshold of the simulated aerial image is chosen such that the 45p90V pitch is printed on size, i.e. the resulting image has a CD of 45 nm at zero defocus.

Figure 5C:
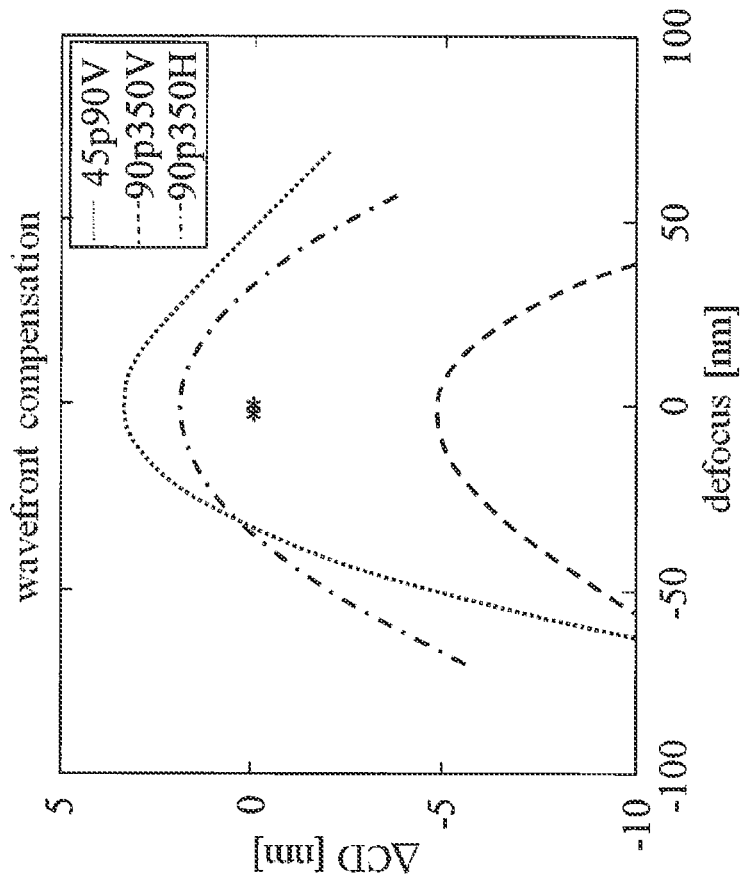
FIG. 5c shows an example of the relation of defocus and critical dimension for three structures with a compensating wavefront.
Figure 5E:
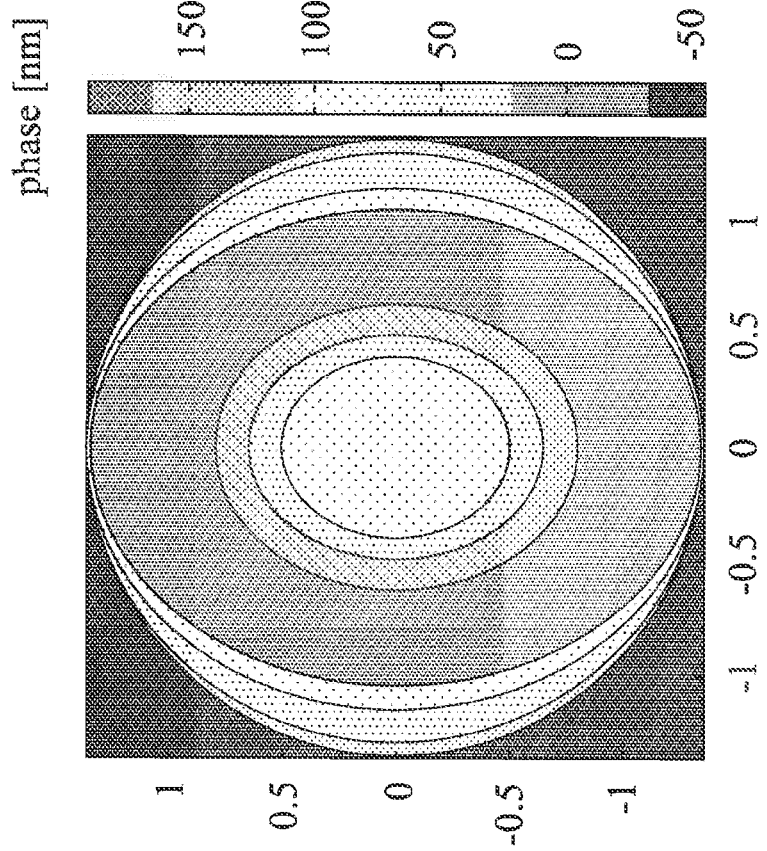
FIG. 5e shows the compensating wavefront in the projections systems pupil.
Figure 5F:
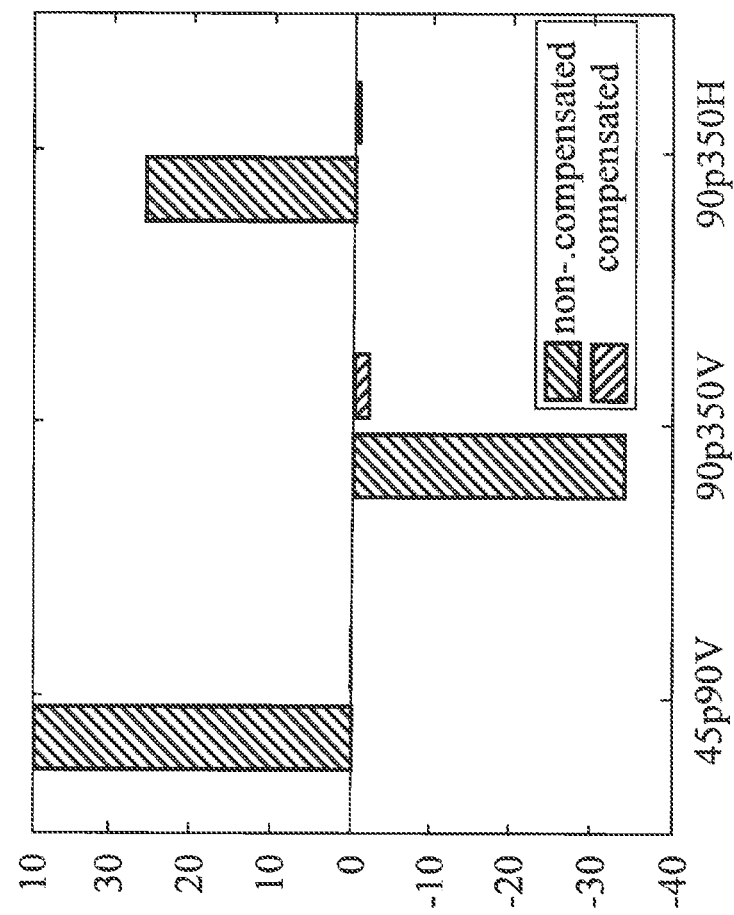
FIG. 5f shows the comparison of the best focus locations without and with compensating wavefront.

As in FIG. 5a the abscissa in FIG. 5b is the amount of defocus. In contrast to FIG. 5a the defocus is given in nanometer instead of micrometer. The ordinate shows the deviation $\Delta CD$ of the critical dimension CD in nanometers of the respective CDs of the chosen three structures at zero defocus. The CD is given relative to a normalized value of 0 nm and also the defocus is given relative to a normalized focus position of 0 nm. The three stars indicate the respective best focus locations of the three structures. These locations apparently do not coincide. The upper line of the table of FIG. 5d shows the numerical values of these best focus locations relative to the chosen origin of FIG. 5b. Those are within a smallest interval of approximately 74 nm. The width of this interval can be understood as a measure of the instability of the lithographic process, i.e. the smaller the interval the more stable is the CD-variation with respect to focus variations. FIG. 5f shows the best focus locations graphically.

If such three types of structures 45p90V, 90p350V, and 90p350H are to be imaged simultaneously one can modify the wavefront of the projection optics in order to compensate for the rigorous effects of the mask, c.f. the above discussion of the first class of projection exposure apparatuses. If the phase profile of FIG. 5e is added to the wavefront the best foci of the three structures approximately fall to a common location as illustrated in FIG. 5c and quantified in the second row of the table of FIG. 5d. Apparently, the above interval of 74 nm shrinks down to 0.4 nm, which means that all three structures are imaged at their optimal focus positions. FIG. 5f graphically shows the three best focus locations before and after application of the wavefront of FIG. 5e. The wavefront of FIG. 5e consists of a superposition of 60 nm $Z_5$, 70 nm $Z_9$, and 60 nm $Z_{12}$, normalized to a pupil radius of 1.35 which can be generated by one or a plurality of manipulators as described in EP678768A2, EP 1670041A1, WO 2008037496A2, US 20030234918A1. US 20090257032A1 and WO 2009026970A1, EP 851304A2, US 20030063268A1, and WO 2007062794A1.

As a side effect, the application of the wavefront of FIG. 5e also leads to a significant CD change in the aerial image, which, however, can be compensated by an appropriate change of the line width on the reticle.

FIG. 6a shows two process windows of an EUV projection exposure apparatus, the abscissa of which shows the defocusing in nm and the ordinate of which illustrates the intensity threshold IT. The process windows are shown for a resist threshold which image V structures in a manner true to scale in their width, an illumination setting of $\sigma$=0.5 and a structure width of 32 nm. The structures of the mask are produced by a layer having the thickness of 80 nm. The CRA has an angle of 6° and the object-side numerical aperture of the object is NA=0.3. The upper window shows the process window for a pitch of 64 nm, while the lower window shows the process window for a pitch of 150 nm. It emerges that the relative defocusing of H to V structures primarily occurs at the pitch of 150 nm and leads to a displacement of the process window, while the process window for the pitch of 64 nm is not affected, or is only slightly affected thereby. The common process window for H and V structures, which corresponds to the intersection of the two process windows above, is thereby reduced. As a result of the setting of the manipulator according to any of the above formulations formulation 1 to formulation 6, although the process window is not necessarily increased, the deflection of a manipulator for correcting the wavefront aberration of the pitch that is to be imaged the most critically ultimately leads to fewer rejects in the production of an integrated circuit to be produced. In the case of the methods according to the 6th, 8th or 10th formulation, the process window can even be increased since the wavefront aberration of the H and V structures can be corrected independently of one another. During the production of the integrated circuit and the exposure of the wafer, a fixed resist threshold is already predefined by the use of the photoresist of the wafer. The process windows, with regard to their ordinate, are then no longer defined by the intensity threshold IT but rather by the dose D which can still be set in the production process. However, since the dose is antiproportional to the intensity threshold IT for a fixedly chosen resist, in this case as well the process windows have the same form as illustrated in FIG. 6a and the same problem as illustrated above arises.

FIG. 6b shows a pupil of an objective of an EUV projection exposure apparatus. The abscissa and the ordinate of the pupil coordinates assume their maximum values in each case at the value 0.32, which corresponds to the object-side numerical aperture of the objective. The smaller circles situated in the pupil represent the diffraction orders that pass through the pupil. Their diameter corresponds to a σ setting of 0.3. A periodic V structure having an extent of 20 nm is imaged by the objective. In the left-hand illustration, the period corresponds to a pitch p40 of 40 nm; in the middle illustration, the period corresponds to a pitch p60 of 60 nm; and in the right-hand illustration, the period corresponds to a pitch p80 of 80 nm. It can readily be discerned that, in the case of a pitch of 40 nm, i.e. in the case of the left-hand illustration, only the 0-th diffraction order and parts of the −1-th and +1-th diffraction orders pass through the pupil. The distance between them corresponds to approximately 0.12. Therefore, δ from the 6th formulation corresponds to approximately 0.12, that is to say approximately to one-sixth of the pupil diameter. If the pitch increases in extent, the further diffraction orders can pass through the pupil, but the distance between them decreases until the diffraction orders overlap in the case of a pitch of 60 nm, such as e.g. in the right-hand illustration, and δ=0 thus holds true.

Figure 6C:
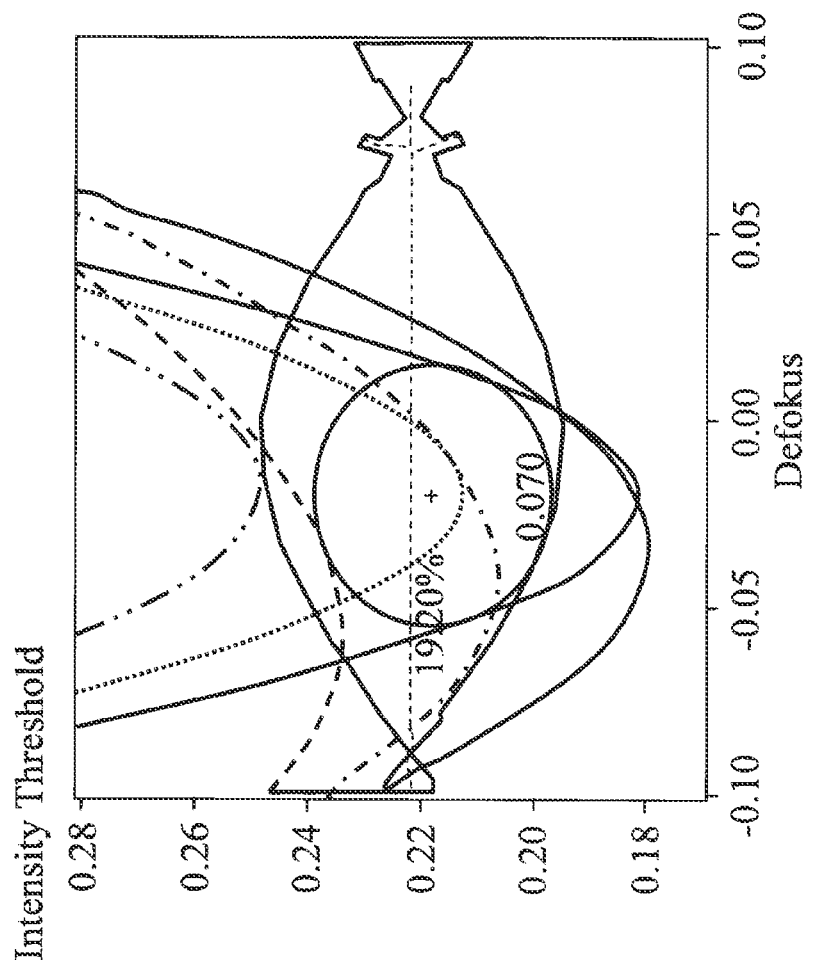
FIG. 6c shows the resultant different process windows of the different pitches.

FIG. 6c shows the respective defocusings resulting from the rigorous effect (already discussed) in the case of the three pitches for FIG. 6b. These result from a thickness of the structure layer of 50 nm in the case of a CRA of 6° and affect the individual diffraction orders to different extents. Accordingly, different defocusings arise for the different pitches. −6 nm defocus arises for the 40 nm pitch, −21 nm defocus for the 60 nm pitch, and −35 nm defocus for the 80 nm pitch. These values relate to a reference which corresponds to a defocus of 0 nm and to which the position of the focus of the objective without the wavefront aberrations induced by the mask corresponds. The optimum depth of focus DOF of 70 nm is achieved for these three pitches in the case of a defocusing of −21 nm. The best intensity threshold IT that can be set is 0.218, and the resultant common process window has an area of 0.002 micrometer.

Figure 6D:
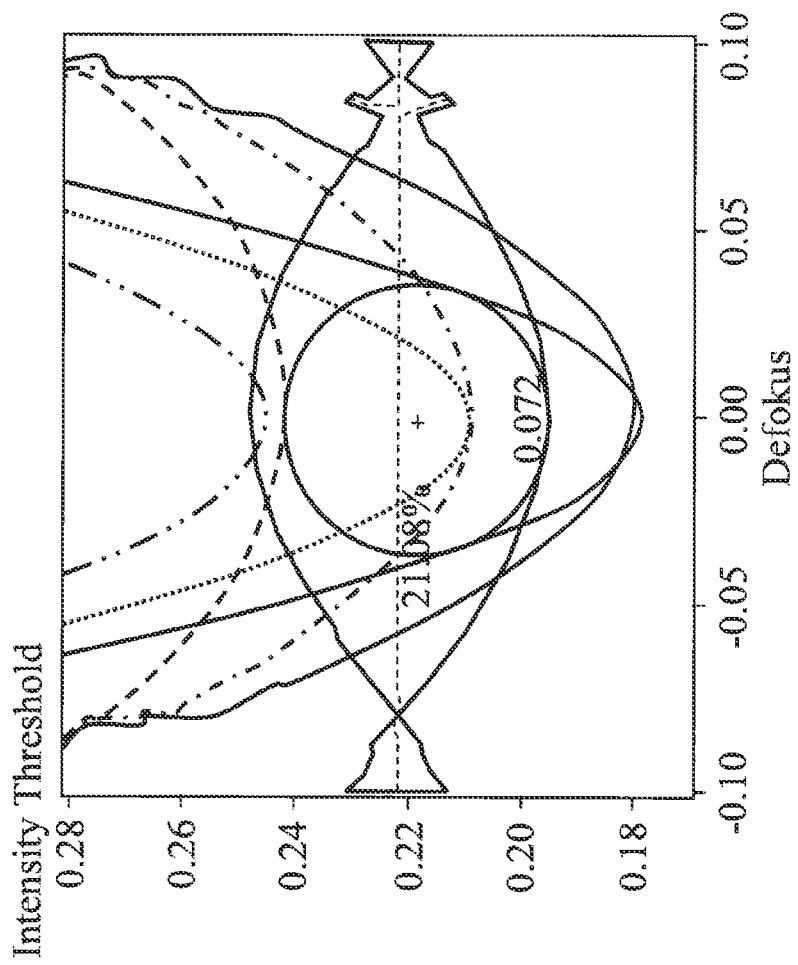
FIG. 6d shows the process windows of the different pitches resulting after the wavefront manipulation according to the disclosure in a pupil of the objective.

FIG. 6d shows the process windows after a manipulation according to the disclosure of the phase of the wavefront by a manipulator which acts on an optical element of the objective which is situated in a pupil plane of the objective. Since the diffraction orders of the three pitches from FIGS. 6b and 6c are not disjoint, the method according to the 6th formulation cannot be employed here even through δ>0 holds true for the diffraction orders of the pitches 40 nm and 60 nm. Therefore, the individual pitches are to be rated in accordance with their importance for the integrated circuit to be imaged, or the common process window for these three pitches is maximized. This is the case in FIG. 6d. If use is made of one of the abovementioned manipulators which acts on an optical element of the objective which is situated in a pupil plane of the objective, and which manipulates the phase of the wavefront with −0.7 nm of the Zernike polynomial $Z_9$, then the individual pitches are virtually no longer defocused relative to one another. A slight increase in the intensity threshold IT to 0.219 results in a common process window having an area of 0.003μ in the case of a depth of focus DOF increasing to 72 nm.

FIG. 7 shows a projection exposure apparatus 700 in the first class for imaging an object field 701 onto an image field 702. The projection apparatus 700 contains an objective 710.

By way of example two field points 703 and 704 situated in the object field are illustrated, which are imaged into the image plane 702 by the objective. The objective contains optical elements such as lenses 711, mirrors 712 and plane plates 713. A manipulator 721 acts on one of the lenses, which manipulator can displace, bend, heat and/or cool the lens. A second manipulator 722 acts on the mirror 712 in the same way and a third manipulator 723 serves for exchanging the plane plate 713 for a further plane plate (not illustrated here) which is aspherized, or it serves for locally heating a fixedly installed plane plate 713. The manipulator which acts on the lens 711, the mirror 712 or in heating fashion on the plane plate 713 is preferably spatially resolving within the meaning of the 5th formulation and the lens or the mirror or the plane plate is respectively situated in a pupil plane of the objective 710. A further manipulator of the objective, which for example is likewise of one of the abovementioned types and is not illustrated here, manipulates a further optical element of the objective. This is not situated in a pupil plane of the objective. In the case of a predefined image-side numerical aperture, maximum light beams limited by the aperture emerge from the two field points 703 and 704. The outermost rays of the beams are illustrated in a dashed fashion here. These outermost rays delimit the wavefront respectively associated with the field points 703 and 704. For the purposes of the illustration of the disclosure, these wavefronts are assumed to be spherical. A wavefront sensor and/or further sensors and/or a prediction model form(s) a determining unit 770, which supplies information about image aberrations or wavefronts after the passage thereof through the objective. The further sensors are, for example, air pressure sensors, sensors for measuring the temperature in the objective or sensors that measure the temperature on lenses or on the rear side of mirrors. The manipulators 721, 722, 723 are controlled by a controller 730, and they counteract for example wavefront aberrations which are brought about by the heating of optical elements of the projection exposure apparatus and such as are determined by the determining unit. The controller 730 has a memory 740 according to the 7th formulation, for storing the assignment table according to the 7th formulation, which assigns manipulator deflections for at least one of the manipulators 721, 722, 723 to a set of different pitches and/or structure widths. When the projection exposure apparatus is coordinated with a mask, the pitches that are critical for the function of the integrated circuit are determined and the at least one of the manipulators 721, 722, 723 is deflected in accordance with the assignment table in order to compensate for the wavefront aberrations induced by the pitch. The field profiles of the wavefront aberrations that are induced by the pitch are compensated for by the further manipulator.

Figure 8:
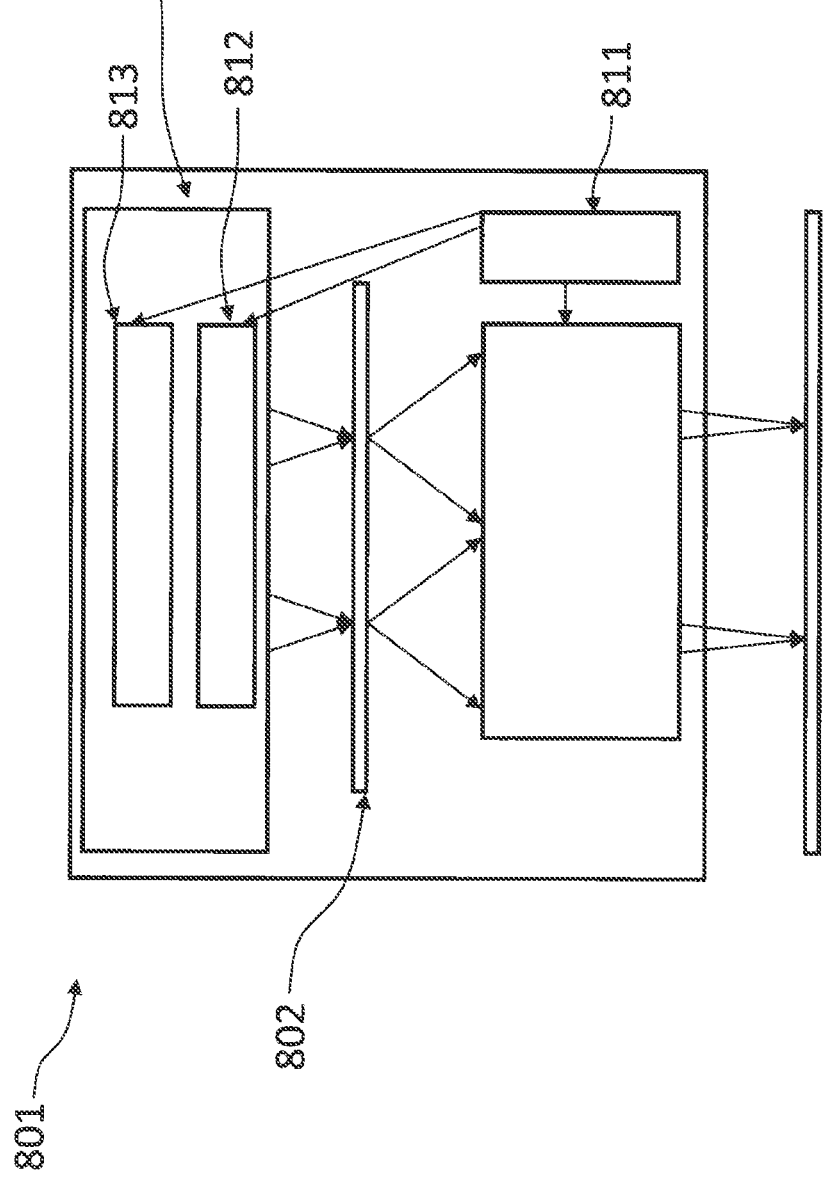
FIG. 8 shows a projection exposure apparatus with a manipulator that additionally influences the polarization and a manipulator that additionally influences the setting.

FIG. 8 shows a projection exposure apparatus 801. The course of the illumination light through the projection exposure apparatus is illustrated schematically by arrows. The illumination system 803 illuminates the mask 802. In the illumination system 803, the illumination setting or a freeform illumination can be set by a manipulator of the illumination system 812. Diffractive optical elements DOEs, which set dipole, quadrupole or annular settings, or a spatial light modulator SLM, which is embodied as a multimirror array and which sets a freeform illumination, are used as manipulators. In addition, the polarization of the illumination light can also be set by a further manipulator 813 of the illumination system. In the controller 811, in accordance with the method according to the 8th formulation, depending on the pitches or structure widths of the mask, alongside a manipulator deflection, the setting or the freeform illumination and, according to the 10th formulation, the polarization of the illumination light are also manipulated.

Figure 9A:
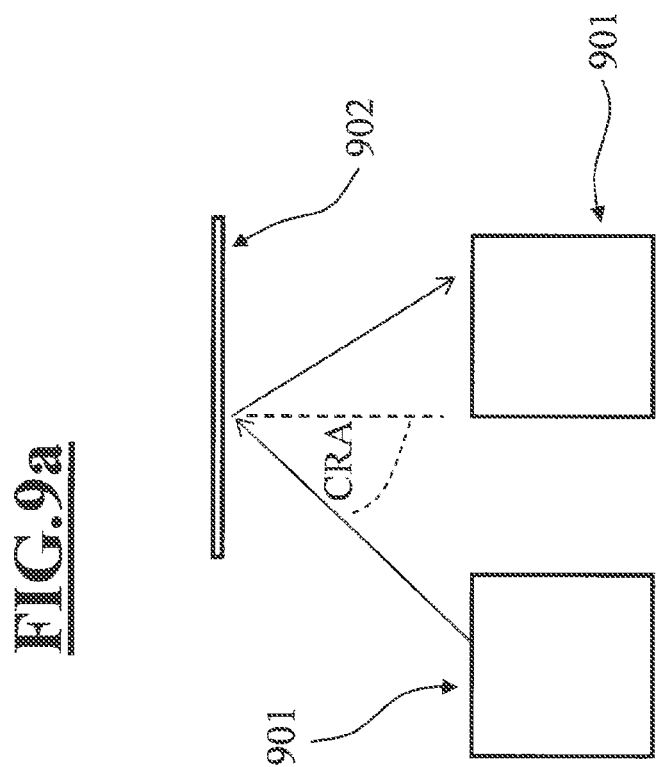
FIGS. 9a and 9b show an illustration of the unavoidability of the shading effects on account of a CRA >0° and a design of an EUV objective for a CRA of 6°.

FIG. 9a shows an EUV projection exposure apparatus. It can be discerned that the geometrical arrangement of illumination system 901, mask 902 and objective 903 involve a CRA >0°.

Figure 9B:
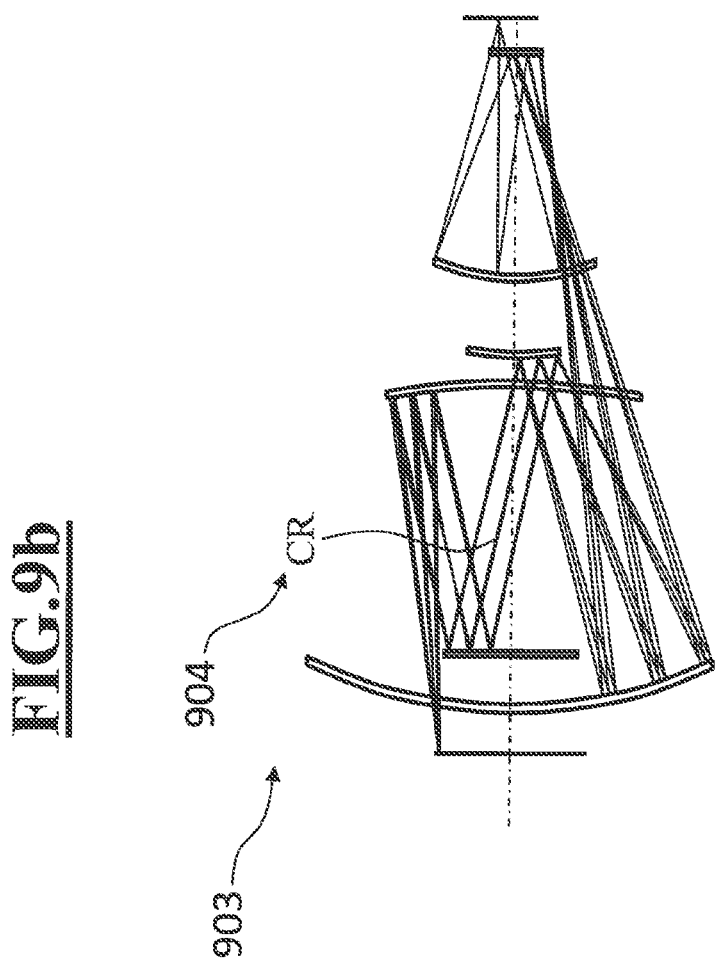

In FIG. 9b, which is taken from the prior art and shows an objective 903 of an EUV projection exposure apparatus, a chief ray angle CRA of 6° is used, the chief ray CR being designated by 904.

What is claimed is:

1. A method, comprising:
  providing a microlithography projection exposure apparatus, comprising:
    an illumination system to illuminate a mask with illumination light and to produce different illumination settings, the mask having a plurality of different pitches and/or structure widths in different structure directions of the mask; and
    an objective to image the mask situated in an object plane of the objective onto an object situated in an image plane of the objective, the objective comprising a manipulator having different manipulator deflections to manipulate a wavefront of the imaging of the objective; and
  adapting the microlithography projection exposure apparatus to the mask by a process which comprises:
    setting an illumination setting or a freeform illumination in the illumination system;
    determining a manipulator deflection which reduces: a) wavefront aberrations caused by the defined pitches and/or defined structure widths of the mask; and b) wavefront aberrations which are independent of the defined pitches and/or defined structure widths of the mask; and
    deflecting the manipulator according to the determined manipulator deflection,
  wherein the method further comprises:
    defining a first of the structure directions of the mask;
    defining two different pitches P1 and P2 of the different pitches or two different structure widths S1 and S2 of the different structure widths of the first structure direction;
    determining the wavefront aberration of the different pitches P1 and P2 or of the different structure widths S1 and S2;
    determining a first manipulator deflection M1 which reduces the wavefront aberration of pitch P1 or of the structure width S1;
    when the wavefront aberration of the pitches P1 and P2 or of the structure widths S1 and S2 is different, determining a second manipulator deflection M2 which reduces the wavefront aberration of pitch P2 or of the structure width S2, defining a relative weighting $\alpha\in[0,1]$ of the pitches P1 with respect to P2 or of the structure widths S1 and S2, and deflecting the manipulator by the value $\alpha M1+(1-\alpha)M2$; and
    when the wavefront aberration of the pitches P1 and P2 or of the structure widths S1 and S2 is not different, deflecting the manipulator by the value M1.

2. The method of claim 1, further comprising:
  determining a change in the illumination setting or a change in the freeform illumination so that, by virtue of the change in the illumination setting or the change in the freeform illumination and the deflection of the manipulator, the wavefront aberrations caused by the different pitches and/or different structure widths of the mask are not increased.

3. The method of claim 1, further comprising:
  determining a change in the polarization of the illumination light, so that by virtue of the change in the polarization and deflection of the manipulator, the wavefront aberrations caused by the different pitches and/or different structure widths are not increased.

4. The method of claim 1, wherein the objective further comprises a second manipulator to correct a field dependence of the wavefront aberration.

5. A method of, comprising:
  providing a microlithography projection exposure apparatus, comprising:
    an illumination system to illuminate a mask with illumination light and to produce different illumination settings, the mask having a plurality of different pitches and/or structure widths in different structure directions of the mask; and
    an objective to image the mask situated in an object plane of the objective onto an object situated in an image plane of the objective, the objective comprising a manipulator having different manipulator deflections to manipulate a wavefront of the imaging of the objective; and
  adapting the microlithography projection exposure apparatus to the mask by a process which comprises:
    setting an illumination setting or a freeform illumination in the illumination system;
    determining a manipulator deflection which reduces: a) wavefront aberrations caused by the defined pitches and/or defined structure widths of the mask; and b) wavefront aberrations which are independent of the defined pitches and/or defined structure widths of the mask; and
    deflecting the manipulator according to the determined manipulator deflection,
  wherein the method further comprises:
    defining a first of the structure directions of the mask;
    defining a second, different than the first, of the structure directions of the mask;
    defining a pitch or a structure width which occurs in the first and also in the second structure direction of the mask;
    determining the wavefront aberrations of the pitch or of the structure width for the first structure direction and also for the second structure direction;
    determining a first manipulator deflection M1 which reduces the wavefront aberration of the pitch or of the structure width of the first structure direction;
    when the wavefront aberration of the pitch or of the structure width for the first structure direction and for the second structure direction is different, determining a second manipulator deflection M2 which reduces the wavefront aberration of the pitch or of the structure width of the second structure direction, defining a relative weighting $\alpha\in[0,1]$ of the structure directions, and deflecting the manipulator by the value $\alpha M1+(1-\alpha)M2$; and
    when the wavefront aberration of the pitch or of the structure width for the first structure direction and for the second structure direction is not different, deflecting the manipulator by the value M1.

6. The method of claim 5, further comprising:
  determining a change in the illumination setting or a change in the freeform illumination so that, by virtue of the change in the illumination setting or the change in the freeform illumination and the deflection of the manipulator, the wavefront aberrations caused by the different pitches and/or different structure widths of the mask are not increased.

7. The method of claim 5, further comprising:
determining a change in the polarization of the illumination light, so that by virtue of the change in the polarization and deflection of the manipulator, the wavefront aberrations caused by the different pitches and/or different structure widths are not increased.

8. The method of claim 5, wherein the objective further comprises a second manipulator to correct a field dependence of the wavefront aberration.

9. A method, comprising:
providing a microlithography projection exposure apparatus, comprising:
an illumination system to illuminate a mask with illumination light and to produce different illumination settings, the mask having a plurality of different pitches and/or structure widths in different structure directions of the mask; and
an objective to image the mask situated in an object plane of the objective onto an object situated in an image plane of the objective, the objective comprising a manipulator having different manipulator deflections to manipulate a wavefront of the imaging of the objective; and
adapting the microlithography projection exposure apparatus to the mask by a process which comprises:
setting an illumination setting or a freeform illumination in the illumination system;
determining a manipulator deflection which reduces: a) wavefront aberrations caused by the defined pitches and/or defined structure widths of the mask; and b) wavefront aberrations which are independent of the defined pitches and/or defined structure widths of the mask; and
deflecting the manipulator according to the determined manipulator deflection,
wherein the manipulator is in a pupil plane of the objective, the manipulator can influence the phase of the wavefront in a spatially resolved fashion up to $\delta$ times the pupil diameter for $\delta \in [0, 0.5]$ a first of the pitches or a first of the structure widths is defined, an n-th diffraction order of the first pitch or of the first structure width is defined, a second of the pitches or a second of the structure width is defined, an m-th diffraction order of the second pitch or of the second structure width is defined, such that the n-th diffraction order of the first pitch or of the first structure width and the m-th diffraction order of the second pitch or of the second structure width are spaced apart from one another by at least $\delta$ times the pupil diameter, the wavefront aberrations of the first pitch or of the first structure width and the wavefront aberrations of the second pitch or of the second structure width are determined, a first manipulator deflection M1 is determined which reduces the phase error of the wavefront aberration of the first pitch or of the first structure width at the location of its n-th diffraction order and which leaves the phase of the wavefront invariant at the other locations of the pupil, a second manipulator deflection M2 is determined which reduces the phase error of the wavefront aberration of the second pitch or of the second structure width at the location of its m-th diffraction order and which leaves the phase of the wavefront invariant at the other locations of the pupil, and the manipulator is deflected by the value M1+M2.

10. The method of claim 9, further comprising:
determining a change in the illumination setting or a change in the freeform illumination so that, by virtue of the change in the illumination setting or the change in the freeform illumination and the deflection of the manipulator, the wavefront aberrations caused by the different pitches and/or different structure widths of the mask are not increased.

11. The method of claim 9, further comprising:
determining a change in the polarization of the illumination light, so that by virtue of the change in the polarization and deflection of the manipulator, the wavefront aberrations caused by the different pitches and/or different structure widths are not increased.

12. The method of claim 9, wherein the objective further comprises a second manipulator to correct a field dependence of the wavefront aberration.

13. A method, comprising:
providing a microlithography projection exposure apparatus, comprising:
an illumination system to illuminate a mask with illumination light and to produce different illumination settings, the mask having a plurality of different pitches and/or structure widths in different structure directions of the mask; and
an objective to image the mask situated in an object plane of the objective onto an object situated in an image plane of the objective, the objective comprising a manipulator having different manipulator deflections to manipulate a wavefront of the imaging of the objective;
providing the mask having the plurality of different pitches and/or structure widths in different structure directions of the mask;
setting an illumination setting or a freeform illumination in the illumination system;
determining a manipulator deflection which reduces: a) wavefront aberrations caused by the defined pitches and/or defined structure widths of the mask; and b) wavefront aberrations which are independent of the defined pitches and/or defined structure widths of the mask; and
deflecting the manipulator according to the determined manipulator deflection,
wherein the method further comprises:
defining a first of the structure directions of the mask;
defining two different pitches P1 and P2 of the different pitches or two different structure widths S1 and S2 of the different structure widths of the first structure direction;
determining the wavefront aberration of the different pitches P1 and P2 or of the different structure widths S1 and S2;
determining a first manipulator deflection M1 which reduces the wavefront aberration of pitch P1 or of the structure width S1;
when the wavefront aberration of the pitches P1 and P2 or of the structure widths S1 and S2 is different, determining a second manipulator deflection M2 which reduces the wavefront aberration of pitch P2 or of the structure width S2, defining a relative weighting $\alpha \in [0, 1]$ of the pitches P1 with respect to P2 or of the structure widths S1 and S2, and deflecting the manipulator by the value $\alpha M1 + (1-\alpha)M2$; and when the wavefront aberration of the pitches P1 and P2 or of the structure widths S1 and S2 is not different, deflecting the manipulator by the value M1.

14. The method of claim 13, further comprising: determining a change in the illumination setting or a change in the freeform illumination so that, by virtue of the change in the illumination setting or the change in the freeform illumination and the deflection of the manipulator, the wavefront aberrations caused by the different pitches and/or different structure widths of the mask are not increased.

15. The method of claim 13, further comprising: determining a change in the polarization of the illumination light, so that by virtue of the change in the polarization and deflection of the manipulator, the wavefront aberrations caused by the different pitches and/or different structure widths are not increased.

16. The method of claim 13, wherein the objective further comprises a second manipulator to correct a field dependence of the wavefront aberration.

17. A method, comprising:
providing a microlithography projection exposure apparatus, comprising:
an illumination system to illuminate a mask with illumination light and to produce different illumination settings, the mask having a plurality of different pitches and/or structure widths in different structure directions of the mask; and
an objective to image the mask situated in an object plane of the objective onto an object situated in an image plane of the objective, the objective comprising a manipulator having different manipulator deflections to manipulate a wavefront of the imaging of the objective;
providing the mask having the plurality of different pitches and/or structure widths in different structure directions of the mask;
setting an illumination setting or a freeform illumination in the illumination system;
determining a manipulator deflection which reduces: a) wavefront aberrations caused by the defined pitches and/or defined structure widths of the mask; and b) wavefront aberrations which are independent of the defined pitches and/or defined structure widths of the mask; and
deflecting the manipulator according to the determined manipulator deflection,
wherein the method further comprises:
defining a first of the structure directions of the mask;
defining a second, different than the first, of the structure directions of the mask;
defining a pitch or a structure width which occurs in the first and also in the second structure direction of the mask;
determining the wavefront aberrations of the pitch or of the structure width for the first structure direction and also for the second structure direction;
determining a first manipulator deflection M1 which reduces the wavefront aberration of the pitch or of the structure width of the first structure direction;
when the wavefront aberration of the pitch or of the structure width for the first structure direction and for the second structure direction is different, determining a second manipulator deflection M2 which reduces the wavefront aberration of the pitch or of the structure width of the first structure direction, defining a relative weighting $\alpha \in [0,1]$ of the structure directions, and deflecting the manipulator by the value $\alpha M1+(1-\alpha)M2$; and
when the wavefront aberration of the pitch or of the structure width for the first structure direction and for the second structure direction is not different, deflecting the manipulator by the value M1.

18. The method of claim 17, further comprising: determining a change in the illumination setting or a change in the freeform illumination so that, by virtue of the change in the illumination setting or the change in the freeform illumination, the wavefront aberrations caused by the different pitches and/or different structure widths of the mask are not increased.

19. The method of claim 17, further comprising: determining a change in the polarization of the illumination light, so that by virtue of the change in the polarization and deflection of the manipulator, the wavefront aberrations caused by the different pitches and/or different structure widths are not increased.

20. The method of claim 17, wherein the objective further comprises a second manipulator to correct a field dependence of the wavefront aberration.

21. A method, comprising:
providing a microlithography projection exposure apparatus, comprising:
an illumination system to illuminate a mask with illumination light and to produce different illumination settings, the mask having a plurality of different pitches and/or structure widths in different structure directions of the mask; and
an objective to image the mask situated in an object plane of the objective onto an object situated in an image plane of the objective, the objective comprising a manipulator having different manipulator deflections to manipulate a wavefront of the imaging of the objective;
providing the mask having the plurality of different pitches and/or structure widths in different structure directions of the mask;
setting an illumination setting or a freeform illumination in the illumination system;
determining a manipulator deflection which reduces: a) wavefront aberrations caused by the defined pitches and/or defined structure widths of the mask; and b) wavefront aberrations which are independent of the defined pitches and/or defined structure widths of the mask; and
deflecting the manipulator according to the determined manipulator deflection,
wherein the manipulator is in a pupil plane of the objective, the manipulator can influence the phase of the wavefront in a spatially resolved fashion up to $\delta$ times the pupil diameter for a $\delta \in [0,0.5]$, a first of the pitches or a first of the structure widths is defined, an n-th diffraction order of the first pitch or of the first structure width is defined, a second of the pitches or a second of the structure width is defined, an m-th diffraction order of the second pitch or of the second structure width is defined, such that the n-th diffraction order of the first pitch or of the first structure width and the m-th diffraction order of the second pitch or of the second structure width are spaced apart from one another by at least $\delta$ times the pupil diameter, the wavefront aberrations of the first pitch or of the first structure width and the wavefront aberrations of the second pitch or of the second structure width are determined, a first manipulator deflection M1 is determined which reduces the phase error of the wavefront aberration of the first pitch or of the first structure width at the location of its n-th diffraction order and which leaves the phase of the wavefront invariant at the other locations of the pupil, a second manipulator deflection M2 is determined which reduces the phase error of the wavefront aberration of the second pitch or of the second structure width at the location of its m-th diffraction order and which leaves the phase of the wavefront invariant at the other locations of the pupil, and the manipulator is deflected by the value M1+M2.

22. The method of claim 21, further comprising:
determining a change in the illumination setting or a change in the freeform illumination so that, by virtue of the change in the illumination setting or the change in the freeform illumination and the deflection of the manipulator, the wavefront aberrations caused by the different pitches and/or different structure widths of the mask are not increased.

23. The method of claim 21, further comprising:
determining a change in the polarization of the illumination light, so that by virtue of the change in the polarization and deflection of the manipulator, the wavefront aberrations caused by the different pitches and/or different structure widths are not increased.

24. The method of claim 21, wherein the objective further comprises a second manipulator to correct a field dependence of the wavefront aberration.

* * * * *